(12) United States Patent
Dai et al.

(10) Patent No.: US 11,825,642 B1
(45) Date of Patent: Nov. 21, 2023

(54) MEMORY CELL, 3D MEMORY AND PREPARATION METHOD THEREFOR, AND ELECTRONIC DEVICE

(71) Applicant: BEIJING SUPERSTRING ACADEMY OF MEMORY TECHNOLOGY, Beijing (CN)

(72) Inventors: Jin Dai, Beijing (CN); Yong Yu, Beijing (CN); Jing Liang, Beijing (CN)

(73) Assignee: BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 0 days.

(21) Appl. No.: 18/312,389

(22) Filed: May 4, 2023

Related U.S. Application Data

(63) Continuation of application No. PCT/CN2022/137319, filed on Dec. 7, 2022.

(30) Foreign Application Priority Data

Oct. 18, 2022 (CN) .......................... 202211269945.4

(51) Int. Cl.
  *H10B 12/00* (2023.01)
(52) U.S. Cl.
  CPC .................................... *H10B 12/00* (2023.02)
(58) Field of Classification Search
  CPC ...................................................... H10B 12/00
  See application file for complete search history.

(56) References Cited

U.S. PATENT DOCUMENTS

| 2008/0310213 | A1 | 12/2008 | Chen et al. |
| 2022/0068933 | A1 | 3/2022 | Smythe, III et al. |
| 2022/0392901 | A1 | 12/2022 | Liu et al. |

FOREIGN PATENT DOCUMENTS

| CN | 114203639 A | 3/2022 |
| CN | 114334980 A | 4/2022 |
| CN | 114446963 A | 5/2022 |
| CN | 114864583 A | 8/2022 |
| CN | 115020480 A | 9/2022 |
| CN | 115346987 A | 11/2022 |

OTHER PUBLICATIONS

First Office Action for Chinese Application No. 202211269945.4, dated Nov. 22, 2022, 18 Pages (including English Translation).
International Search Report and Written Opinion for International Application No. PCT/CN2022/137319, dated Jun. 28, 2023, 12 Pages (including English Translation).

*Primary Examiner* — Allison Bernstein
(74) *Attorney, Agent, or Firm* — BROOKS KUSHMAN P.C.

(57) ABSTRACT

A memory cell, a 3D memory and a preparation thereof, and an electronic device. The memory cell includes a first transistor and a second transistor disposed on a substrate, the first transistor includes a first gate, a first electrode, a second electrode and a first semiconductor layer disposed on the substrate; the second transistor includes a third electrode, a fourth electrode, a second gate extending in a direction perpendicular to the substrate and a second semiconductor layer surrounding a sidewall of the second gate which are disposed on the substrate, the second semiconductor layer includes a second source contact region and a second drain contact region arranged at intervals, a channel between the second source contact region and the second drain contact region is a horizontal channel.

25 Claims, 16 Drawing Sheets

MEMORY CELL, 3D MEMORY AND PREPARATION METHOD THEREFOR, AND ELECTRONIC DEVICE

CROSS-REFERENCE TO RELATED APPLICATIONS

This application is a continuation of International PCT Application No. PCT/CN2022/137319 filed on Dec. 7, 2022, which claims priority to Chinese Patent Application No. 202211269945.4 filed on Oct. 18, 2022, which are hereby incorporated herein by reference in their entireties.

TECHNICAL FIELD

The embodiments of the present disclosure relate to, but are not limited to, the technical field of semiconductors, in particular to a memory cell, a 3D memory and a preparation method therefor, and an electronic device.

BACKGROUND

At present, the common memory cell structure of Dynamic Random Access Memory (DRAM) is of a 1T1C type, i.e. a structure in which a source of a transistor is connected with a capacitor. This structure uses a capacitor to store data, but the electric quantity of capacitor may be consumed when reading, and the capacitor itself may have electric leakage, so it is needed to refresh charges in the capacitor constantly, which means a relatively large power consumption. In addition, since the process of manufacturing capacitors occupies a large area, miniaturization becomes a difficult problem.

Two Transistor zero Capacitor (2T0C) uses two transistors as a cell structure without Capacitor which is used to store information, using gate capacitance to store charges and changing transistor transconductance to store information.

SUMMARY

The following is a summary of the subject matter described in detail herein. This summary is not intended to limit the protection scope of the claims.

Embodiments of the present disclosure provide a memory cell including a first transistor and a second transistor disposed on a substrate.

The first transistor includes a first gate, a first electrode, a second electrode and a first semiconductor layer disposed on the substrate, the first gate extends in a direction parallel to the substrate.

The second transistor includes a third electrode, a fourth electrode, a second gate extending in a direction perpendicular to the substrate, and a second semiconductor layer surrounding a sidewall of the second gate which are disposed on the substrate, the first gate is connected to the second semiconductor layer; the second semiconductor layer includes a second source contact region and a second drain contact region arranged at intervals, the third electrode is in contact with the second source contact region of the second semiconductor layer, the fourth electrode is in contact with the second drain contact region of the second semiconductor layer, and a channel between the second source contact region and the second drain contact region is a horizontal channel. In an exemplary embodiment, on a plane perpendicular to the substrate, an orthographic projection of the first gate is overlapped with an orthographic projection of the third electrode, an orthographic projection of the third electrode is overlapped with an orthographic projection of the fourth electrode, and the first gate of the first transistor and the third electrode of the second transistor are of an integrated structure.

In an exemplary embodiment, the first gate is connected to the second source contact region of the second semiconductor layer.

In an exemplary embodiment, on a plane perpendicular to the substrate, an orthographic projection of the first electrode is overlapped with an orthographic projection of the first gate.

In an exemplary embodiment, the second drain contact region of the second semiconductor layer and the second source contact region of the second semiconductor layer are located at a sidewall of the second semiconductor layer and arranged oppositely at intervals.

In an exemplary embodiment, the second electrode surrounds and is connected with the first semiconductor layer, on a plane perpendicular to the substrate, a cross section of the second electrode has an annular opening, and the first semiconductor layer is located within the opening of the second electrode.

In an exemplary embodiment, the first electrode is disposed at a side of the second electrode away from the second gate.

In an exemplary embodiment, the first semiconductor layer includes a sidewall and two ends, the first semiconductor layer includes a first source contact region and a first drain contact region, the first source contact region is located at the sidewall of the first semiconductor layer and surrounds the first semiconductor layer, and the first drain contact region is located at the sidewall of the first semiconductor layer and surrounds the first semiconductor layer, or located at one of the two ends away from the second gate.

In an exemplary embodiment, the first electrode extends in a third direction, the first gate extends in a second direction, the third electrode extends in the second direction, and the fourth electrode extends in the third direction, the second direction and the third direction intersects with each other and are parallel to the substrate.

In an exemplary embodiment, on a plane parallel to the substrate, an orthographic projection of the first electrode and an orthographic projection of the second electrode are not overlapped; an orthographic projection of the third electrode and an orthographic projection of the fourth electrode are not overlapped.

In an exemplary embodiment, on a cross section perpendicular to the substrate, the first electrode, the second electrode, the third electrode are located at a first side of the second gate, and the fourth electrode is located at a second side of the second gate, and the first side and the second side are two opposite sides.

In an exemplary embodiment, a distance between a surface at a side of the first electrode close to the substrate and the substrate is less than a distance between a surface at a side of the third electrode close to the substrate and the substrate, a distance between a surface at a side of the first electrode away from the substrate and the substrate is greater than a distance between a surface at a side of the third electrode away from the substrate and the substrate.

In an exemplary embodiment, film layers of the third electrode and the fourth electrode are different regions of a same conductive film layer and are arranged at intervals, the same conductive film layer is approximately parallel to the substrate.

In an exemplary embodiment, the second transistor further includes: a second gate insulation layer disposed between the second gate and the second semiconductor layer and surrounding the sidewall of the second gate. In a direction perpendicular to the substrate, the length of the second semiconductor layer is less than or equal to the length of the second gate insulation layer, and is greater than or equal to the length of the third electrode, and is greater than or equal to the length of the fourth electrode.

In an exemplary embodiment, the materials of the first semiconductor layer and the second semiconductor layer include a metal oxide semiconductor material.

In an exemplary embodiment, a metal in the metal oxide semiconductor material includes at least one of indium, tin, zinc, aluminum, and gallium.

Embodiments of the present disclosure provide a memory cell including a read transistor and a write transistor disposed on a substrate.

The read transistor includes a first gate, a first semiconductor layer, a first source and a first drain; the first semiconductor layer surrounds the first gate; the first gate extends in a direction parallel to the substrate.

The write transistor includes a second gate, a second semiconductor layer, a second source and a second drain; the second semiconductor layer surrounds the second gate; the second gate extends in a direction perpendicular to the substrate, and the second source of the write transistor is connected to the first gate of the read transistor.

A channel of the second semiconductor layer of the write transistor is a horizontal channel.

In an exemplary embodiment, the read transistor and write transistor are arranged at intervals on the substrate along a direction parallel to the substrate.

In an exemplary embodiment, the second gate extends in a direction perpendicular to the substrate and has a sidewall, the second semiconductor layer surrounds the sidewall, the second semiconductor layer includes a second source contact region.

The first gate extends in a direction parallel to the substrate and has a sidewall and two ends, the first semiconductor layer at least surrounds the sidewall, one of the two ends extends to the second source contact region of the second semiconductor layer to be in contact with the second semiconductor layer.

In an exemplary embodiment, the sidewall of the second semiconductor layer further include a second drain contact region; the second source contact region and the second drain contact region are located in different regions of the sidewall of the second semiconductor layer, and orthographic projections of the second source contact region and the second drain contact region in a plane perpendicular to the substrate have an overlapped region, such that a channel between the second source contact region and the second drain contact region is parallel to the substrate.

The sidewall of the first semiconductor layer has a first source contact region and a first drain contact region, and a channel between the first source contact region and the first drain contact region is parallel to the substrate.

Embodiments of the present disclosure provide a 3D memory including a plurality of layers of memory cells stacked in a direction perpendicular to a substrate.

Each layer of the memory cell includes a read transistor and a write transistor.

The read transistor includes a first gate, a first semiconductor layer, a first source, and a first drain, the first gate extends in a direction parallel to the substrate; the write transistor includes a second gate, a second semiconductor layer, a second source, and a second drain, the second gate extends in a direction perpendicular to the substrate.

The second source of the write transistor is connected with the first gate of the read transistor; the first semiconductor layer surrounds the first gate and the second semiconductor layer surrounds the second gate; a channel of the second semiconductor layer of the write transistor is a horizontal channel.

In an exemplary embodiment, the read transistor and write transistor in the same layer are arranged at intervals on the substrate along a direction parallel to the substrate.

In an exemplary embodiment, the first gate of the read transistor and the second source of the write transistor are of an integrated structure.

In an exemplary embodiment, the first gate extends along a second direction parallel to the substrate.

The first semiconductor layer includes a first source contact region and a first drain contact region, and the second semiconductor layer includes a second source contact region and a second drain contact region.

Each layer of the memory cell further includes a first bit line and a second bit line extending along a third direction parallel to the substrate, the third direction intersects with the second direction; the first bit line is connected to the first drain contact region of the first semiconductor layer, and the second bit line is connected to the second drain contact region of the second semiconductor layer.

Each layer of the memory cell further includes a first word line and a second word line respectively extending in the direction perpendicular to the substrate.

The first word line is respectively connected to first source contact regions of first semiconductor layers of the memory cells of different layers, and the second word line is respectively connected to second gates of the memory cells of different layers.

In an exemplary embodiment, the first word line surrounds the sidewall of each first semiconductor layer of the memory cells of different layers and is connected to the first source contact region of the sidewall of each first semiconductor layer.

In an exemplary embodiment, the first gate has a sidewall, a first end connected to the second source contact region of the second semiconductor layer, and a second end connected to the first bit line.

Embodiments of the present disclosure provide a preparation method for a 3D memory, wherein the 3D memory includes a plurality of layers of memory cells stacked in a direction perpendicular to a substrate, a first word line and a second word line, each layer of the memory cell includes a read transistor and a write transistor, the read transistor includes a first gate, a first semiconductor layer, a first source and a first drain, the write transistor includes a second gate, a second semiconductor layer, a second source and a second drain.

The preparation method includes:

providing a substrate;

depositing an insulation thin film and a metal thin film alternately on the substrate in sequence, patterning to form a stacked structure including an insulation layer and a metal layer arranged alternately, wherein the metal layer includes a first sub-portion and a second sub-portion connected with each other, and a first drain of the read transistor;

etching the stacked structure to form a through hole penetrating through the stacked structure, etching the first sub-portion to form a first channel, etching the second sub-portion to form a second channel, wherein the first channel and the second channel are communicated with the through hole;

depositing a semiconductor thin film, a gate insulation thin film and a metal thin film completely filling the channel sequentially on a sidewall of a channel constituted by the first channel, the second channel and the through hole, etching the gate insulation thin film and the metal thin film in the through hole to form a first semiconductor layer, a second source, a first gate located in the first channel and a second drain located in the second channel;

depositing a semiconductor thin film on a sidewall of the through hole to form a second semiconductor layer of the write transistor, wherein the second semiconductor layer includes a second source contact region and a second drain contact region arranged at intervals, the second source is in contact with the second source contact region, the second drain is in contact with the second drain contact region; a channel between the second source contact region and the second drain contact region is a horizontal channel;

depositing a metal thin film in the through hole to completely fill the through hole to form the second word line, wherein second gates of write transistors of different layers are part of the second word line;

patterning to form the first word line extending along a direction perpendicular to the substrate, wherein first sources of read transistors of different layers are part of the first word line.

Embodiments of the present disclosure provide an electronic device including the memory cell described in any of the above embodiments.

Other features and advantages of the present disclosure will be set forth in the description which follows, and in part will be obvious from the description, or may be learned by practice of the present disclosure. The objects and advantages of the present disclosure can be realized and obtained by the structures particularly pointed out in the specification and drawings.

Other aspects will become apparent after reading and understanding the drawings and detailed description.

BRIEF DESCRIPTION OF THE DRAWINGS

The accompanying drawings are provided to provide a further understanding of the technical solution of the present disclosure and constitute a part of the specification and serve to explain the technical solution of the present disclosure together with the disclosed embodiments, but do not intend to limit the technical solution.

DETAILED DESCRIPTION

Figure 1A:
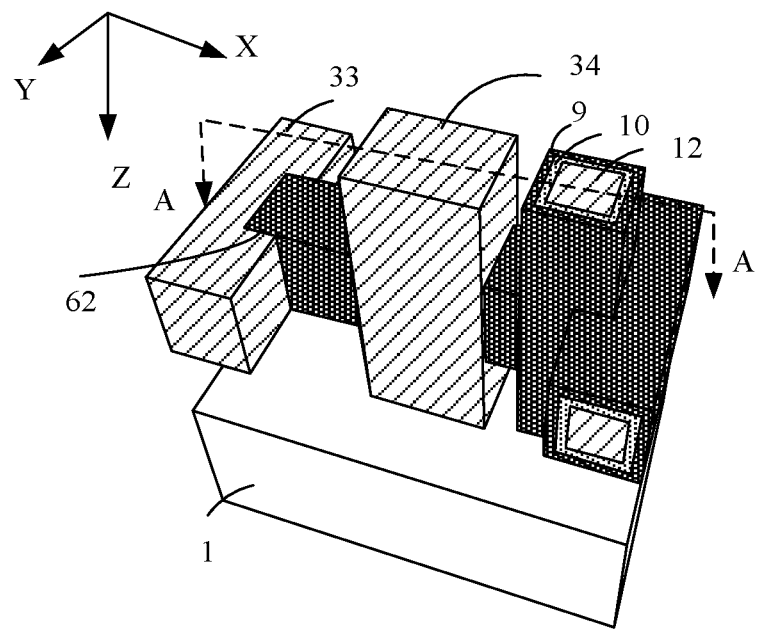
FIG. 1A is a schematic diagram of a memory cell provided according to an exemplary embodiment.

Hereinafter, embodiments of the present disclosure will be described in detail with reference to the accompanying drawings. The embodiments in the present disclosure and the features in the embodiments may be combined with each other arbitrarily if there is no conflict.

Unless otherwise defined, technical terms or scientific terms used in the present disclosure shall have a general meaning as understood by a person of ordinary skill in the art to which the present disclosure pertains.

Thus, embodiments of the present disclosure are not necessarily limited to this dimension, and the shape and size of each component in the drawings do not reflect true proportions. Further, the drawings schematically illustrate ideal examples, but embodiments of the present disclosure are not limited to shapes or values shown in the drawings.

Ordinal numerals such as "first", "second" and "third" in the present disclosure are provided to avoid confusion of constituent elements, but do not indicate any order, quantity or importance.

In the present disclosure, for convenience, words and expressions indicating orientation or positional relationship such as "middle", "upper", "lower", "front", "rear", "vertical", "horizontal", "top", "bottom", "inner" and "outer" are employed to explain the positional relationship of the constituent elements with reference to the accompanying drawings, they are employed for ease of description and simplification of the description only, but do not indicate or imply that the referred device or element must have a particular orientation, be constructed and operate in a particular orientation, and therefore cannot be construed as limiting to the present disclosure. The positional relationship of the constituent elements is appropriately changed according to the direction in which each constituent element is described. Therefore, it is not limited to the words and expressions described in the present disclosure, and can be appropriately replaced according to the situation.

In the present disclosure, the terms "mounted", "connected" and "connection" are to be understood broadly, unless otherwise expressly specified and defined. For example, it can be a fixed connection, a detachable connection, or an integrated connection; it can be a mechanical connection or an electrical connection; it can be direct connection, indirect connection through an *intermedia*, or internal communication between two elements. For those of ordinary skill in the art, the meaning of the above terms in the present disclosure may be understood according to actual situation.

In the present disclosure, a transistor refers to an element including at least three terminals, i.e., a gate, a drain, and a source. A transistor has a channel region between a drain (drain terminal, drain region, or drain electrode) and a source (source terminal, source region, or source electrode), and a current can flow through the drain, the channel region, and the source. In the present disclosure, the channel region refers to the region through which the current mainly flows.

In the present disclosure, an electrode may be a source or a drain, and one of the two electrodes of the same transistor is a source and the other is a drain.

In the present disclosure, "electrical connection" includes the case where the constituent elements are connected together by elements having certain electrical effects. There are no special restrictions on "elements with certain electrical effects" as long as they can give and receive electrical signals between connected constituent elements. Examples of "elements having certain electrical effects" include not only electrodes and wiring, but also switching elements such as transistors, resistors, inductors, capacitors, and other elements having various functions, etc.

In the present disclosure, "parallel" refers to approximately parallel or almost parallel, for example, refers to a state in which the angle formed by two straight lines is more than −10 degrees and less than 10 degrees, and therefore also includes a state in which the angle is more than −5 degrees and less than 5 degrees. In addition, "perpendicular" refers to "approximately perpendicular", for example, refers to a state in which the angle formed by two straight lines is more than 80 degrees and less than 100 degrees, and therefore also includes a state in which the angle is more than 85 degrees and less than 95 degrees.

The "A and B are an integrated structure" in embodiments of the present disclosure may mean that there is no obvious boundary interface, such as obvious faults or gaps, viewed from the microstructure. Generally, the connected film layers formed by patterning on one film layer are an integrated structure. For example, A and B use the same material to form one film layer and simultaneously form a structure with a connection relationship through the same patterning process.

Embodiments of the application provide a 2T0C with a novel structure aiming at a 2T0C memory cell, which is more conducive to the design of a high-density memory cell in terms of space, and to industrialization of a memory cell and a 3D memory in terms of process.

Figure 1B:
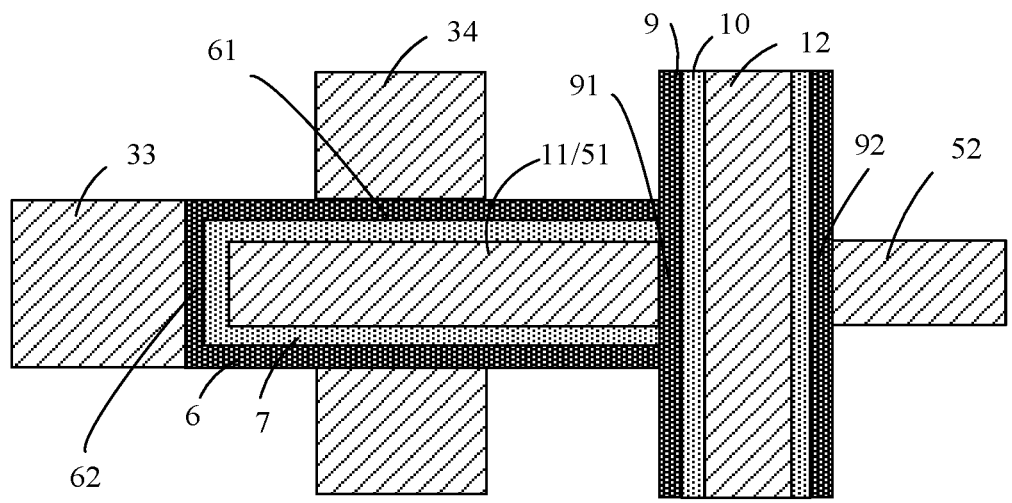
FIG. 1B is a cross section diagram in a direction AA of the memory cell shown in FIG. 1A.

FIG. 1A is a schematic diagram of a three-dimensional structure of a memory cell including both word lines and bit lines provided according to an exemplary embodiment. FIG. 1B is a cross section diagram in a direction AA of the memory cell shown in FIG. 1A. As shown in FIG. 1A, the embodiment provides a memory cell, which can include: a first transistor and a second transistor disposed on a substrate 1, the first transistor may include a first gate 11, a first semiconductor layer 6, a first electrode 33 and a second electrode 34 disposed on the substrate 1, the second transistor may include a third electrode 51, a fourth electrode 52, and a second gate 12 extending in a first direction Z (perpendicular to the direction of the substrate 1), and a second semiconductor layer 9 surrounding a sidewall of the second gate 12 which are disposed on the substrate 1, the first gate 11 is connected to the second semiconductor layer 9; the second semiconductor layer 9 includes a second source contact region 91 and a second drain contact region 92 arranged at intervals, the third electrode 51 is in contact with the second source contact region 91 and the fourth electrode 52 is in contact with the second drain contact region 92, and a channel between the second source contact region 91 and the second drain contact region 92 is a horizontal channel.

According to the 2T0C design scheme with a novel structure provided in the present application, the gate of the second transistor is a vertical structure and the channel is a horizontal channel and the second transistor is not stacked with the first transistor, so that the size of the memory cell in a direction perpendicular to the substrate can be reduced, and the 3D stack of the 2T0C memory cell with a compact structure can be conveniently manufactured, thus simplifying the process and reducing the cost. The not-stacked structure can be understood as an arrangement at intervals on the substrate, for example, being arranged at intervals in a direction parallel to the substrate.

According to the solution provided according to the embodiment, the second semiconductor layer 9 of the second transistor surrounds the second gate 12, the source contact region 91 and the drain contact region 92 on the second semiconductor layer 9 are arranged such that a direction of the channel between the third electrode 51 and the fourth electrode 52 of the second transistor generally extends in a direction parallel to the substrate 1, for example, in one implementation, orthographic projections of the third electrode 51 and the fourth electrode 52 in a direction parallel to the first direction are overlapped. The structure of this memory is designed as a novel structure, which makes the structure between the first transistor and the second transistor more compact. In addition, when manufacturing the 3D stacked memory cell, the gate of the second transistor in each stack can be connected as a word line, and the word line extending in the vertical direction makes the process of 2T0C structure simple and space-saving.

The horizontal channel described in an embodiment of the present application can be understood as a non-perpendicular channel, and the horizontal channel can be an embodiment in which the length direction of the channel or the transport direction of the carrier is in a plane parallel to the substrate.

In some embodiments, the horizontal channel may be a planar channel rather than a non-perpendicular channel, which means that the carrier of the channel extends in a direction substantially parallel to the substrate rather than perpendicular to the substrate.

The channel extending in a plane can be a straight-line channel, an annular channel or an arc channel. Specifically, it is determined according to the shape of the semiconductor layer between the source and the drain.

In some embodiments, channels of the second transistor and the first transistor may be the horizontal channels described above.

Since the second transistor of the present application has a gate extending in a vertical direction and the channel is a horizontal channel, when manufacturing a stacked 3D structure in the vertical direction, it is facilitated to form a through hole extending in the vertical direction at one time, to form a channel film layer of the memory cell of each layer and a gate insulation layer of the memory cell of each layer at one time in turn on the sidewall of the through hole, and then a gate or word line is filled in the through hole, and different regions of the word line are used as gates of transistors of different layers.

The first transistor has a first gate 11 extends in the horizontal direction and the channel is in the horizontal direction, so as to facilitate spacing between the adjacent first transistors in a plurality of stacked transistors in the vertical direction, thereby achieving a memory cell composed of a first transistor and a second transistor with a compact structure, so as to effectively realize the miniaturization of the device.

The channel may be approximately parallel to the substrate 1, which depends on a relative position between the effective source and drain in practical applications, for example, the outer contours of at least one of the upper and lower surfaces of the electrodes in the longitudinal cross section diagram of the source and drain are on one plane, and the plane is approximately parallel to the main surface of the substrate.

In an exemplary embodiment, the second semiconductor layer 9 extends on the sidewall of the second gate 12 to form an annular semiconductor layer extending in a direction perpendicular to the substrate 1. In an exemplary embodiment, for one transistor, the second semiconductor layer 9 surrounds each region of the sidewall of the gate. Exemplarily, the second semiconductor layer 9 is annular, in the cross section at each position of the second gate 12, the second semiconductor layer 9 is annular, and the size of the annulus is adapted to the outer profile of the cross section of the second gate 12. Or, the second semiconductor layer 9 may be of a partial-surrounded type. For example, in the direction perpendicular to the substrate 1, the semiconductor layer 9 may have a gap. In an exemplary embodiment, the first direction Z may intersect with the substrate 1. In the present disclosure, intersecting with the substrate 1 means intersecting with an upper surface (i.e. a surface on which a first transistor and a second transistor are provided) of the substrate 1, being parallel with the substrate 1 means being parallel with the upper surface of the substrate 1, and being perpendicular to the substrate 1 means being perpendicular to the upper surface of the substrate 1. At this time, a plurality of memory cells can be stacked vertically. However, an embodiment of the present disclosure is not limited thereto, and the first direction Z may be parallel to the substrate 1. In subsequent embodiments, description is made by taking the first direction Z intersecting with the substrate 1 as an example, but the following description can be applied to a scheme where the first direction Z is parallel to the substrate 1 by replacing "being perpendicular to the substrate 1" with "being parallel to the first direction Z", and replacing "being parallel to the substrate 1" with "being perpendicular to the first direction Z".

In an exemplary embodiment, the second transistor may further include a second gate insulation layer 10 disposed between the second gate 12 and the second semiconductor layer 9 and surrounding a sidewall of the second gate 12, the second semiconductor layer 9 is isolated from the second gate 12 through the second gate insulation layer 10. The third electrode 51 and the fourth electrode 52 are insulated from the second gate 12 through the second gate insulation layer 10.

In an exemplary embodiment, on a plane perpendicular to the substrate 1, an orthographic projection of the first gate 11 may be overlapped with an orthographic projection of the third electrode 51.

In an exemplary embodiment, on a plane perpendicular to the substrate 1, an orthographic projection of the first gate 11 may be overlapped with an orthographic projection of the third electrode 51, and an orthographic projection of the third electrode 51 may be overlapped with an orthographic projection of the fourth electrode 52. The first gate 11 of the first transistor is connected to the third electrode 51 of the second transistor.

In an exemplary embodiment, the first gate 11 and the third electrode 51 may be an integrated structure, i.e. the first gate 11 and the third electrode 51 are formed simultaneously using the same material through the same preparation process. However, an embodiment of the present disclosure is not limited thereto, the first gate 11 and the third electrode 51 may not be an integrated structure, and the first gate 11 and the third electrode 51 may be independent electrodes.

Exemplarily, the first gate 11 and the third electrode 51 are one identical electrode extending in the same direction, and this electrode serves as the first gate 11 and the third electrode 51. For example, the first gate 11 extends in a direction parallel to the substrate 1 and its ends extend to a source contact region of the second semiconductor layer to be connected with the source contact region.

In an exemplary embodiment, on a plane perpendicular to the substrate 1, an orthographic projection of the first electrode 33 may be overlapped with an orthographic projection of the first gate 11.

In an exemplary embodiment, the second drain contact region 92 of the second semiconductor layer 9 and the second source contact region 91 of the second semiconductor layer 9 are located at the sidewall of the second semiconductor layer 9 and arranged oppositely at intervals.

In an exemplary embodiment, the first transistor may further include a first gate insulation layer 7 surrounding the first gate 11, a first semiconductor layer 6 surrounding the first gate insulation layer 7. The first electrode 33 is connected to the first semiconductor layer 6. The first semiconductor layer 6 forms an accommodation cavity in which the first gate 11 is disposed, and the first gate insulation layer 7 isolates the first semiconductor layer 6 from the first gate 11.

The first semiconductor layer 6 forms an accommodation cavity which may be a cavity having only one opening or a cavity having two openings, and the cross section of the cavity is annular.

In an exemplary embodiment, the second electrode 34 surrounds and is connected with the first semiconductor layer 6, on a plane perpendicular to the substrate 1, the cross section of the second electrode 34 has an annular opening, and the first semiconductor layer 6 is located within the opening of the second electrode 34.

In an exemplary embodiment, the first electrode 33 may be disposed at a side of the second electrode 34 away from the second gate 12; and may be disposed at a side of the first gate 11 away from the second gate 12.

In an exemplary embodiment, the first semiconductor layer 6 may include a sidewall and two ends, the first semiconductor layer 6 includes a first source contact region 61 and a first drain contact region 62, the first source contact region 61 is located at the sidewall of the first semiconductor layer 6 and surrounds the first semiconductor layer 6, and the first drain contact region 62 is located at the sidewall of the first semiconductor layer 6 and surrounds the first semiconductor layer 6, or at one of the two ends away from the second gate 12.

In an exemplary embodiment, on a cross section perpendicular to the substrate 1, the first electrode 33, the second electrode 34, the third electrode 51 may be located at a first side of the second gate 12, and the fourth electrode 52 may be located at a second side of the second gate 12, and the first side and the second side are two opposite sides.

In an exemplary embodiment, the first electrode 33 may extend in a third direction Y.

In an exemplary embodiment, the length of the second electrode 34 in the third direction Y may be less than the length of the first electrode 33 in the third direction Y. According to the solution provided in the embodiment, the second electrodes 34 of different memory cells can be disconnected from each other when forming the memory cell array. However, an embodiment of the present disclosure is not limited thereto, and the length of the second electrode 34 in the third direction Y may be equal to or greater than the length of the first electrode 33 in the third direction Y.

In an exemplary embodiment, the second electrode 34 may extend in the first direction Z.

In an exemplary embodiment, on the plane perpendicular to the substrate 1, an orthographic projection of the first electrode 33 may be overlapped with an orthographic projection of the first gate 11.

In an exemplary embodiment, on a plane parallel to the substrate 1, an orthographic projection of the first electrode 33 and an orthographic projection of the second electrode 34 may be not overlapped; an orthographic projection of the third electrode 51 and an orthographic projection of the fourth electrode 52 may be not overlapped.

In an exemplary embodiment, in a direction perpendicular to the substrate 1, a first distance between a surface at a side of the third electrode 51 close to the substrate 1 and the substrate 1 and a second distance between a surface at a side of the fourth electrode 52 close to the substrate 1 and the substrate 1 may be the same. However, an embodiment of the present disclosure is not limited thereto, and the first distance and the second distance may be different.

In an exemplary embodiment, in a direction perpendicular to the substrate 1, a first thickness of the third electrode 51 and a second thickness of the fourth electrode 52 may be the same. However, embodiments of the present disclosure are not limited thereto, and the first thickness and the second thickness may be different.

In an exemplary embodiment, a distance between a surface at a side of the third electrode 51 close to the substrate 1 and the substrate 1 may be equal to a distance between a surface at a side of the fourth electrode 52 close to the substrate 1 and the substrate 1, a distance between a surface at a side of the third electrode 51 away from the substrate 1 and the substrate 1 may be equal to a distance between a surface at a side of the fourth electrode 52 away from the substrate 1 and the substrate 1.

In an exemplary embodiment, the film layers of the third electrode 51 and the fourth electrode 52 may be different regions of the same conductive film layer and arranged at intervals, and the same conductive film layer is approximately parallel to the substrate 1.

In an exemplary embodiment, on a plane parallel to the substrate 1, an orthographic projection of the second gate 12 may be located outside an orthographic projection of the third electrode 51, and an orthographic projection of the second gate 12 may be located outside an orthographic projection of the fourth electrode 52.

In an exemplary embodiment, the first direction Z may be perpendicular to the substrate 1.

In an exemplary embodiment, as shown in FIG. 1B, in a cross section perpendicular to the substrate 1, the third electrode 51 is located at a first side of the second gate 12, and the fourth electrode 52 is located at a second side of the second gate 12, and the first side and the second side are two opposite sides. However, an embodiment of the present disclosure is not limited thereto, and the third electrode 51 and fourth electrode 52 may be located at other positions.

In an exemplary embodiment, the third electrode 51 may extend in a second direction X, the fourth electrode 52 may extend in a third direction Y, the second direction X may be parallel to the substrate 1, the third direction Y may be parallel to the substrate 1, and the second direction X may intersect with the third direction Y. However, an embodiment of the present disclosure is not limited thereto, and the third electrode 51 and fourth electrode 52 may be of other shapes.

In an exemplary embodiment, the second direction X and the third direction Y may be perpendicular to each other, but an embodiment of the present disclosure is not limited thereto, and other angles may be formed between the second direction X and the third direction Y.

In an exemplary embodiment, in a direction perpendicular to the substrate 1, the cross section of the first electrode 33 may be square, an embodiment of the present disclosure is not limited thereto, and the cross section of the first electrode 33 may be of other shapes, for example, circular, hexagonal, and the like.

In an exemplary embodiment, in a direction perpendicular to the substrate 1, the cross sections of the third electrode 51 and fourth electrode 52 may be square, an embodiment of the present disclosure is not limited thereto, and the cross sections of the third electrode 51 and fourth electrode 52 may be other shapes, for example, circular, hexagonal, and the like.

In an exemplary embodiment, the third electrode 51 and the fourth electrode 52 may be connected at other positions different from those shown in FIG. 1A, for example, the third electrode 51 is connected at a first side of the annular post constituted by the second semiconductor layer 9, the fourth electrode 52 is connected at a second side of the annular post constituted by the second semiconductor layer 9, and the first side and the second side are adjacent, and so on.

In an exemplary embodiment, the third electrode 51 and the fourth electrode 52 may be simultaneously formed by a one preparation process, but an embodiment of the present disclosure is not limited thereto, and they may be separately prepared by different processes.

In an exemplary embodiment, a distance between a surface at a side of the first electrode 33 close to the substrate 1 and the substrate 1 may be less than a distance between a surface at a side of the third 51 close to the substrate 1 and the substrate 1, a distance between a surface at a side of the first electrode 33 away from the substrate 1 and the substrate 1 may be greater than a distance between a surface at a side of the third electrode 51 away from the substrate 1 and the substrate 1. The thickness of the first electrode 33 may be greater than the thickness of the third electrode 51 in a direction perpendicular to the substrate 1.

In an exemplary embodiment, a distance between a surface at a side of the second electrode 34 away from the substrate 1 and the substrate 1 may be the same as a distance between a surface at a side of the second gate 12 away from the substrate 1 and the substrate 1.

In FIG. 1B, the first semiconductor layer 6 and the second semiconductor layer 9 may be physically connected or not connected. In FIG. 1B, an end of the first semiconductor layer 6 is in contact with a sidewall of the second semiconductor layer 9. However, in some embodiments where separation is needed, the end of the first semiconductor layer 6 is not in contact with the sidewall of the second semiconductor layer 9, and they can be separated by an insulation layer between them when fabricating film layers.

In a 2T0C structure, the first transistor is a read transistor and the second transistor is a write transistor. Generally, the read transistor is turned on and the write transistor needs to be turned off. At this time, the contact of the end of the first semiconductor layer 6 with the sidewall of the second semiconductor layer 9 has no great influence on the operation of the first transistor.

In some embodiments, the end of the first semiconductor layer 6 may be spatially separated from the sidewall of the second semiconductor layer 9 in order to avoid other effects resulting from contact of the end of the first semiconductor layer 6 with the sidewall of the second semiconductor layer 9.

In FIG. 1A, the length of the second semiconductor layer 9 may be equal to the length of the second gate 12 in a direction perpendicular to the substrate 1. However, the embodiments of the present disclosure are not limited thereto. In an exemplary embodiment, in a direction perpendicular to the substrate 1, the length of the second semiconductor layer 9 may be less than or equal to the length of the second gate 12, less than or equal to the length of the second gate insulation layer 10, and the length of the second semiconductor layer 9 is greater than or equal to the length of the third electrode 51, and the length of the second semiconductor layer 9 is greater than or equal to the length of the fourth electrode 52. In the solution provided by an embodiment, the channel length can be shortened to reduce electric leakage.

In an exemplary embodiment, in a direction perpendicular to the substrate 1, the length of the second semiconductor layer 9 may be equal to the length of the second gate insulation layer 10, and the length of the second gate insulation layer 10 may be equal to the length of the second gate 12.

In an exemplary embodiment, in a direction perpendicular to the substrate 1, the length of the second gate insulation layer 10 may be less than the length of the second gate 12, and may be greater than or equal to the length of the second semiconductor layer 9.

In an exemplary embodiment, the first semiconductor layer 6 and the second semiconductor layer 9 may be metal oxide semiconductor layers or semiconductor layers containing silicon.

In an exemplary embodiment, the metal in the metal oxide semiconductor layer may include, but is not limited to, at least one of: indium, tin, zinc, aluminum, gallium.

In an exemplary embodiment, the metal oxide semiconductor layer may include but is not limited to at least one of: indium oxide, tin oxide, indium zinc oxide, tin zinc oxide, aluminum zinc oxide, indium gallium oxide, indium gallium zinc oxide, indium aluminum zinc oxide, indium tin zinc oxide, tin gallium zinc oxide, aluminum gallium zinc oxide, aluminum gallium zinc oxide and tin aluminum zinc oxide.

As shown in FIG. 1B, in a solution provided in an embodiment, the size of the channel between the third electrode 51 and the fourth electrode 52 can be controlled through an overlapped length between the orthographic projection of the third electrode 51 and the orthographic projection of the fourth electrode 52 on a plane perpendicular to the substrate 1. In FIG. 1B, the overlapped length between the orthographic projection of the third electrode 51 and the orthographic projection of the fourth electrode 52 is d, the channel size can be controlled by controlling thicknesses of the third electrode 51 and the fourth electrode 52 in a direction perpendicular to the substrate 1. Compared with a transistor in which a source surrounding the gate and a drain surrounds the gate and the channel size is controlled through changing the size of the through hole where the gate is located (the mask plate needs to be changed) or increasing the distance between the source and the drain (which will lead to the increase of the volume of the transistor), in the present embodiment, the channel size can be controlled more conveniently, with little change in process and little influence on the size of the transistor.

As shown in FIGS. 1A and 1B, embodiments of the present disclosure provide a memory cell including a read transistor and a write transistor disposed on a substrate.

The read transistor may be a first transistor, and the read transistor includes a first gate 11, a first semiconductor layer 6, a first source (which may be a second electrode 34), a first drain (which may be a first electrode 33); the first semiconductor layer 6 surrounds the first gate 11.

The write transistor may be a second transistor, and the write transistor includes a second gate 12, a second semiconductor layer 9, a second source (which may be a third electrode 51), a second drain (which may be a fourth electrode 52); the second semiconductor layer 9 surrounds the second gate 12; the second source of the write transistor is connected to the first gate 11 of the read transistor.

A channel of the second semiconductor layer 9 of the write transistor is a horizontal channel.

In an exemplary embodiment, the second gate 12 extends in a direction perpendicular to the substrate and has a sidewall, the second semiconductor layer 9 surrounds the sidewall, the second semiconductor layer 9 includes a second source contact region 91.

The first gate 11 extends in a direction parallel to the substrate 1 and has a sidewall and two ends, the first semiconductor layer 6 at least surrounds the sidewall, one of the two ends extends to the second source contact region 91 of the second semiconductor layer 9 to be in contact with the second semiconductor layer 9.

In an exemplary embodiment, the sidewall of the second semiconductor layer 9 further include a second drain contact region 92; the second source contact region 91 and the second drain contact region 92 are located in different regions of the sidewall of the second semiconductor layer 9, and orthographic projections of the second source contact region 91 and the second drain contact region 92 in a plane perpendicular to the substrate have an overlapped region, such that a channel between the second source contact region 91 and the second drain contact region 92 is parallel to the substrate 1.

The sidewall of the first semiconductor layer 6 has a first source contact region 61 and a first drain contact region 62, and a channel between the first source contact region 61 and the first drain contact region 62 is parallel to the substrate.

Figure 2:
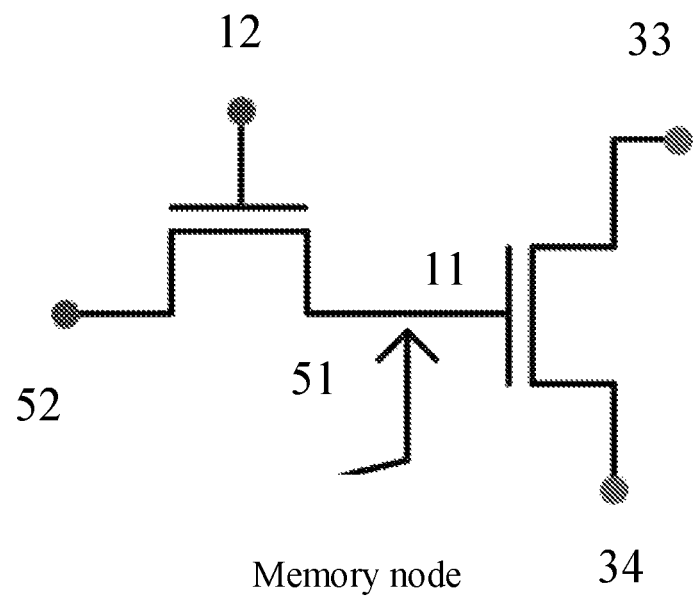
FIG. 2 is an equivalent circuit diagram of a memory cell provided according to an exemplary embodiment.

FIG. 2 is a schematic diagram of an equivalent circuit of a memory cell according to an embodiment of the present disclosure. As shown in FIG. 2, in an exemplary embodiment, the first transistor may act as a read transistor, the second transistor may act as a write transistor, the first electrode 33 may be connected to a read bit line, the second electrode 34 may be connected to a read word line, the second gate 12 may be connected to a write word line, and the fourth electrode 52 may be connected to a write bit line.

A voltage is applied to the write word line (i.e., the second gate 12), the channel is turned on, and the third electrode 51 and the fourth electrode 52 are linked. The read-write process is as follows: (1) when writing "1", a read voltage is applied to the write bit line (i.e., the fourth electrode 52) to inject charges into the memory node (the memory node is between the first gate 11 and the third electrode 51, as indicated by the arrow in FIG. 2), and the first transistor is turned on; when reading "1", a read voltage is applied to the read word line (i.e., the second electrode 34) in a read transistor, and a current passes between the read bit line and the read word line due to certain charges stored in the memory node, or it can be understood that a current passes between the first electrode 33 and the second electrode 34 in the drawing, then the current is amplified and identified by a peripheral circuit to complete the process of reading "1". (2) when writing "0", charges are extracted from the write bit line (i.e., the fourth electrode 52) for a voltage lower than the threshold voltage, and the first transistor is turned off; when reading "0", a read voltage is applied to the read word line (i.e., the second electrode 34) in the read transistor, no or little current passes between the reading bit line (i.e., the first electrode 33) and the reading word line (i.e., the second electrode 34) since there is no charge in the memory node, and then then current is amplified and identified by the peripheral circuit to complete the process of reading "0".

The technical solution of an embodiment is described by the preparation process of the display substrate according to the embodiment in the following description. The "patterning process" in the embodiment includes film deposition, photoresist coating, mask exposure, development, etching, photoresist stripping and other treatments, which are mature preparation processes in the related art. The "photolithography process" in this embodiment includes film layer coating, mask exposure and development, and are mature preparation processes in the related art. The deposition may adopt known processes such as sputtering, evaporation, chemical vapor deposition, the coating may adopt known coating processes, and the etching may adopt known approaches, which are not limited herein. In the description of the embodiment, "thin film" means a thin film made of certain material on a substrate by a deposition or coating process. If the "thin film" does not need a patterning process or photolithography process during the whole manufacturing process, the "thin film" can also be called a "layer". If the "thin film" needs a patterning process or photolithography process during the whole manufacturing process, it is called a "thin film" before the patterning process and a "layer" after the patterning process. The "layer" after the patterning process or photolithography process contains at least one "pattern".

In an exemplary embodiment, the preparation process of the memory cell may include following acts.

Figure 3:
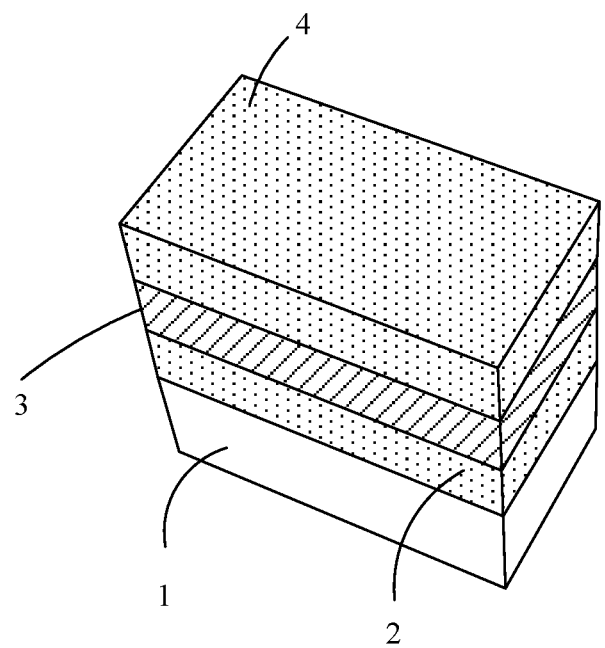
FIG. 3 is a schematic diagram after formation of a third insulation thin film provided according to an exemplary embodiment.

1) A first insulation thin film, a first metal thin film and a second insulation thin film are sequentially deposited on the substrate 1 to form a first insulation layer 2, a first metal layer 3 and a second insulation layer 4, as shown in FIG. 3.

In an exemplary embodiment, the substrate 1 may be prepared using glass, silicon, flexible materials, or the like. The flexible material may be a material such as polyimide (PI), polyethylene terephthalate (PET), or a surface-treated polymer soft film. In an exemplary embodiment, the substrate 1 may be a single-layer structure or a multi-layer stacked structure, and the substrate of the stacked structure may include a flexible material/inorganic material/flexible material, the inorganic material may be, for example, any one or more of silicon nitride (SiNx), silicon oxide (SiOx) and silicon oxynitride (SiON). The substrate 1 may be a semiconductor substrate; for example, it may include at least one elemental semiconductor material (e.g., silicon (Si) substrate, germanium (Ge) substrate, etc.), at least one III-V compound semiconductor material (e.g. gallium nitride (GaN) substrate, gallium arsenide (GaAs) substrate, indium phosphide (InP) substrate, etc.), at least one II-VI compound semiconductor material, at least one organic semiconductor material, or other semiconductor material known in the art.

In an exemplary embodiment, the first insulation thin film and the second insulation thin film may be low-K dielectric layers, i.e. dielectric layers having a dielectric constant $K<3.9$. For example, it may be any one or more of silicon nitride (SiNx), silicon oxide (SiOx), silicon oxynitride (SiON), and silicon carbide (SiC). The first insulation thin film and the second insulation thin film may be made of the same material or different materials.

In an exemplary embodiment, the first metal thin film may include, but is not limited to, at least one of: tungsten (W), aluminum (Al), molybdenum (Mo), ruthenium (Ru), titanium nitride (TiN), and tantalum (Ta).

Figure 4:
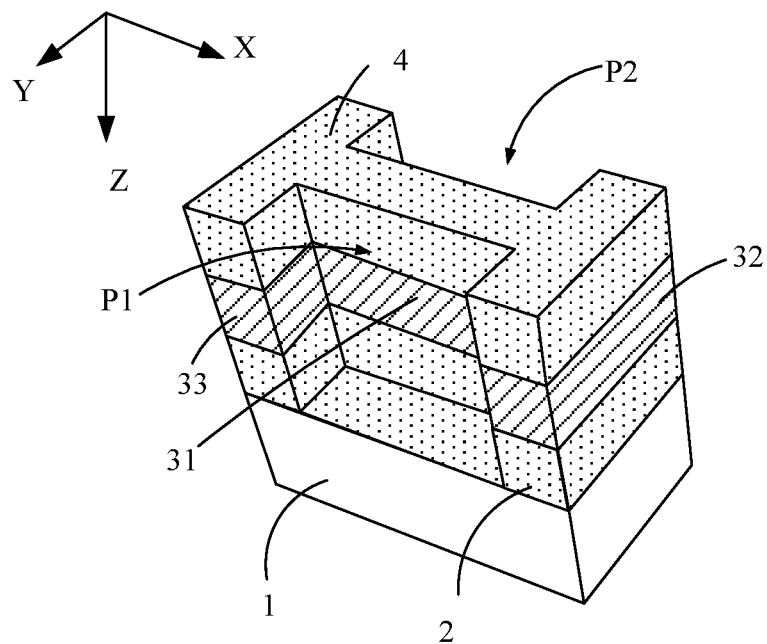
FIG. 4 is a schematic diagram after formation of an opening slot provided according to an exemplary embodiment.

2) The first insulation layer 2, the first metal layer 3 and the second insulation layer 4 are patterned by a patterning process to form a first opening slot P1 and a second opening slot P2, as shown in FIG. 4. The first opening slot P1 penetrates through the first insulation layer 2, the first metal layer 3 and the second insulation layer 4, and the second opening slot P2 penetrates through the first insulation layer 2, the first metal layer 3 and the second insulation layer 4. The first metal layer 3 may include a first sub-portion 31 extending in the second direction X and a second sub-portion 32 extending in the third direction Y, and a first electrode 33 extending in the third direction Y, wherein the first sub-portion 31 connects the second sub-portion 32 and the first electrode 33.

In an exemplary embodiment, on a plane parallel to the substrate 1, the cross sections of the first insulation layer 2, the first metal layer 3, and the second insulation layer 4 may be H-shaped.

In an exemplary embodiment, the size and shape of the first opening slot P1 and those of the second opening slot P2 may be the same, but an embodiment of the present disclosure is not limited thereto, and the size and shape of the first opening slot P1 and those of the second opening slot P2 may be different.

In this embodiment, the pattern of the first metal layer 3 is only an example, and it may be a pattern of other shapes. For example, the current second sub-portion 32 is divided into two parts along the extending direction of the first sub-portion 31, and only one part may be retained as the second sub-portion 32.

Figure 5:
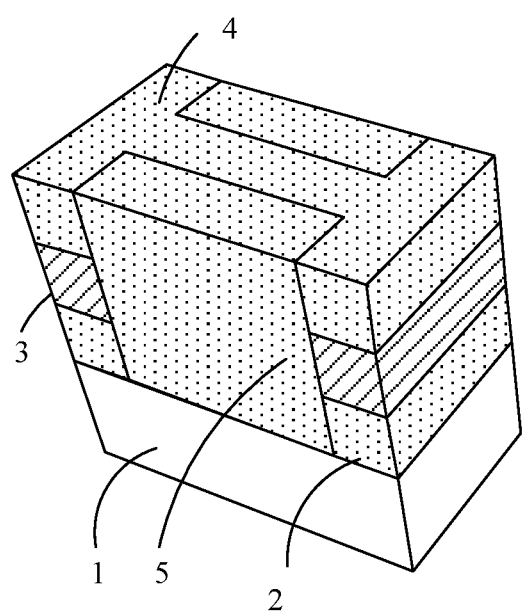
FIG. 5 is a schematic diagram after filling of the opening slot provided according to an exemplary embodiment.

3) A third insulation thin film is deposited on the substrate 1 on which aforementioned patterns are formed to form a third insulation layer 5, wherein the third insulation layer fills the first opening slot P1 and the second opening slot P2, as shown in FIG. 5.

In an exemplary embodiment, the third insulation thin film may be a low-K dielectric layer, i.e. a dielectric layer with a dielectric constant K<3.9, for example, it may be any one or more of silicon nitride (SiNx), silicon oxide (SiOx), silicon oxynitride (SiON), silicon carbide (SiC). The third insulation thin film, the first insulation thin film and the second insulation thin film may be made of the same material or different materials. The subsequent fourth insulation thin film is similar and will not be repeated here.

Figure 6:
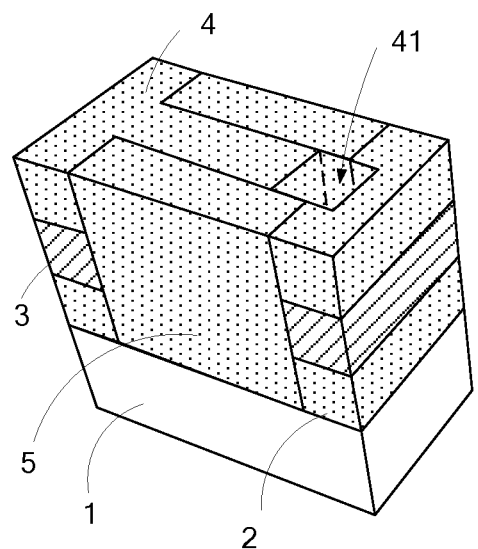
FIG. 6 is a schematic diagram after formation of a through hole provided according to an exemplary embodiment.

4) A through hole 41 penetrating through the first insulation layer 2, the first metal layer 3, and the second insulation layer 4 is formed on the substrate 1 on which aforementioned patterns are formed, wherein an orthographic projection of the through hole 41 may be overlapped with an orthographic projection of the first sub-portion 31 and an orthographic projection of the second sub-portion 32 on a plane parallel to the substrate 1, as shown in FIG. 6. The cross section of the through hole 41 shown in FIG. 6 in a plane parallel to the substrate 1 is quadrilateral, but an embodiment of the present disclosure is not limited thereto, and the cross section of the through hole 41 in a plane parallel to the substrate 1 may be of other shapes, such as circular, pentagonal, hexagonal, and the like.

Figure 7A:
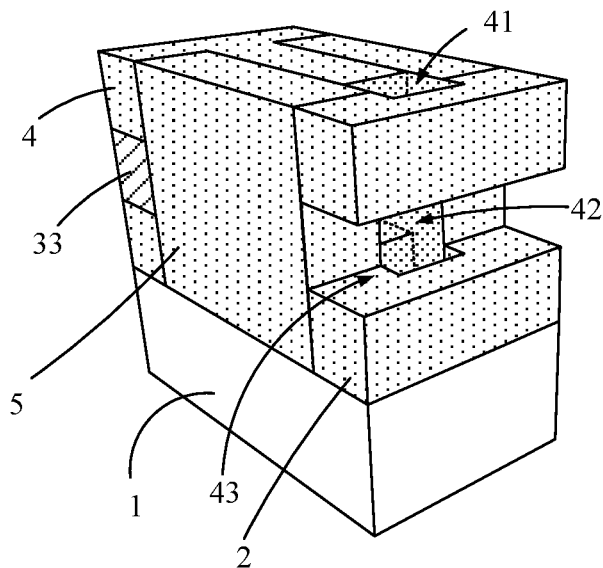
FIG. 7A is a schematic diagram after formation of a channel provided according to an exemplary embodiment.
Figure 7B:
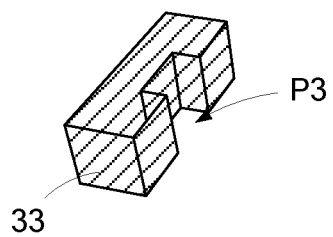
FIG. 7B is a schematic diagram of a first metal layer provided according to an exemplary embodiment.

5) The first sub-portion 31, the second sub-portion 32 in the first metal layer 3 and a junction of the first electrode 33 and the first sub-portion 31 are selectively etched away to leave only the first electrode 33 in the first metal layer 3 at this time, and the first electrode 33 is provided with a third slot P3 facing the first sub-portion 31 (the first sub-portion 31 has been etched away), as shown in FIGS. 7A and 7B, at this time, a first channel 42 formed in a region in which the first sub-portion 31 has been selectively etched away, a second channel 43 formed in a region where the second sub-portion 32 is located, and the through hole 41 are formed, wherein the first channel 42 is communicated with the through hole 41, and the second channel 43 is communicated with the through hole 41.

Figure 8A:
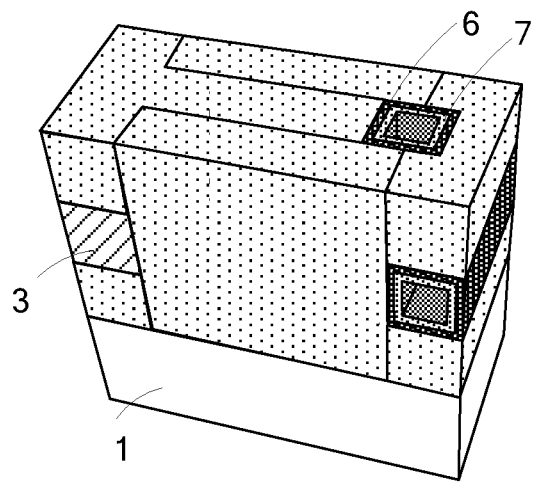
FIG. 8A is a schematic diagram after formation of a first semiconductor layer and a first gate insulation layer provided according to an exemplary embodiment.
Figure 8B:
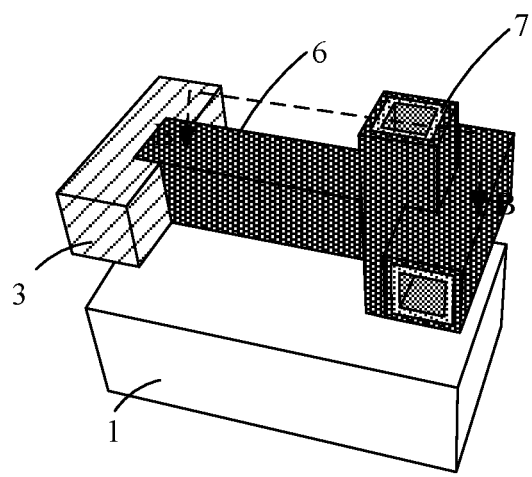
FIG. 8B is a partial schematic diagram of FIG. 8A.
Figure 8C:
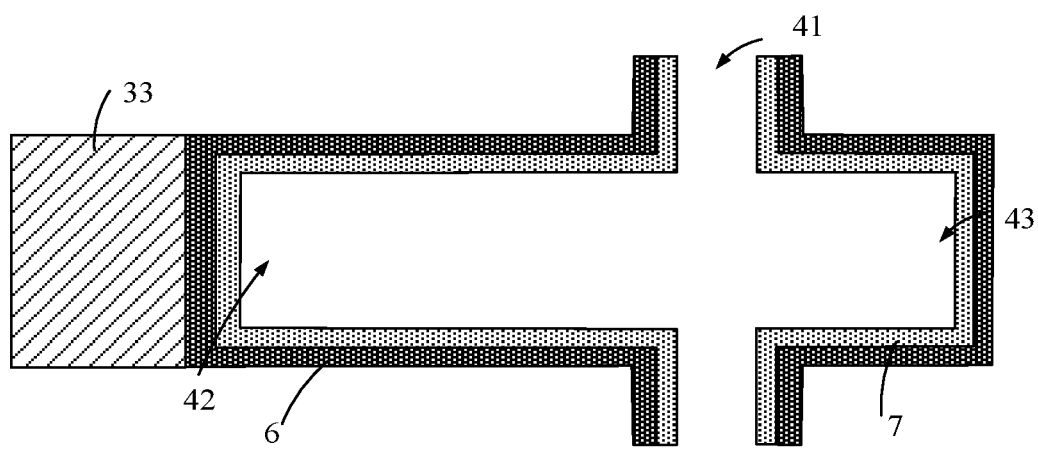
FIG. 8C is a schematic cross section diagram of FIG. 8B taken along a direction BB.

6) A first semiconductor thin film and a first gate oxide thin film thin are sequentially deposited on a sidewall of the channel formed in act 5 (i.e., the through hole 41, the first channel 42 and the second channel 43) to form a first semiconductor layer 6 and a first gate insulation layer 7, as shown in FIGS. 8A, 8B and 8C, wherein FIG. 8C is a cross section diagram of FIG. 8B taken along a direction BB and only shows the first semiconductor layer 6 and the first gate insulation layer 7. At this time, the first semiconductor layer 6 and the first gate insulation layer 7 acts as the channel wall of the channel, and the first semiconductor layer 6 surrounds the first gate insulation layer 7.

In an exemplary embodiment, the first gate oxide thin film may be a High-K dielectric material. The High-K dielectric material may include, but is not limited to, at least one of the following: silicon oxide, aluminum oxide, hafnium oxide.

In an exemplary embodiment, the first semiconductor thin film, which is used as a channel layer, may be a film layer containing silicon, or a metal oxide semiconductor, wherein the metal oxide semiconductor includes, but is not limited to, at least one of the following materials: IGZO, Indium Tin Oxide (ITO), Indium Zinc Oxide (IZO). When IGZO is used as semiconductor layer, it has the advantages of low leakage and short refresh time. A subsequent second semiconductor thin film is similar and will not be repeated here.

In an exemplary embodiment, the first semiconductor thin film and the first gate oxide thin film may be deposited through an Atomic Layer Deposition (ALD) approach.

Figure 9A:
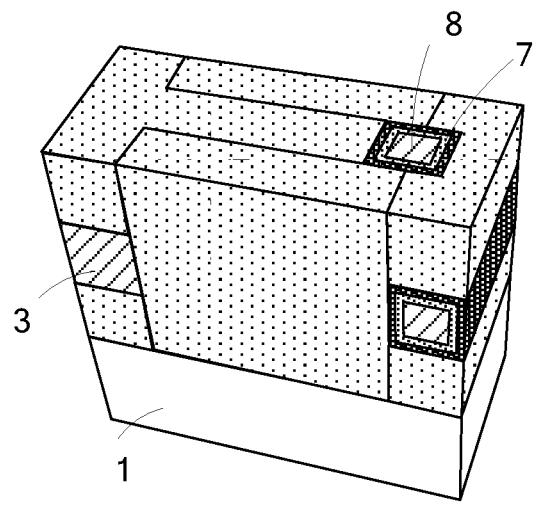
FIG. 9A is a schematic diagram after formation of a second metal layer provided according to an exemplary embodiment.
Figure 9B:
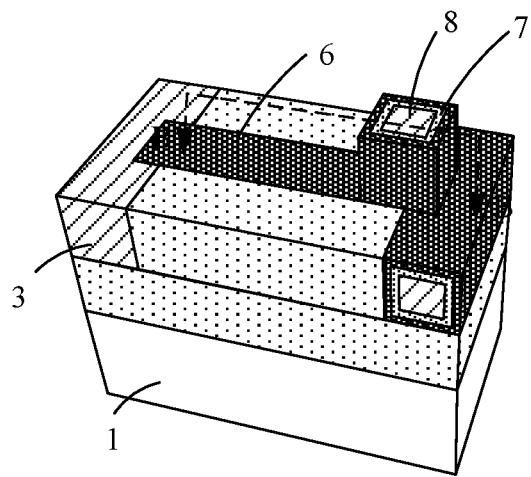
FIG. 9B is a partial schematic diagram of FIG. 9A.
Figure 9C:
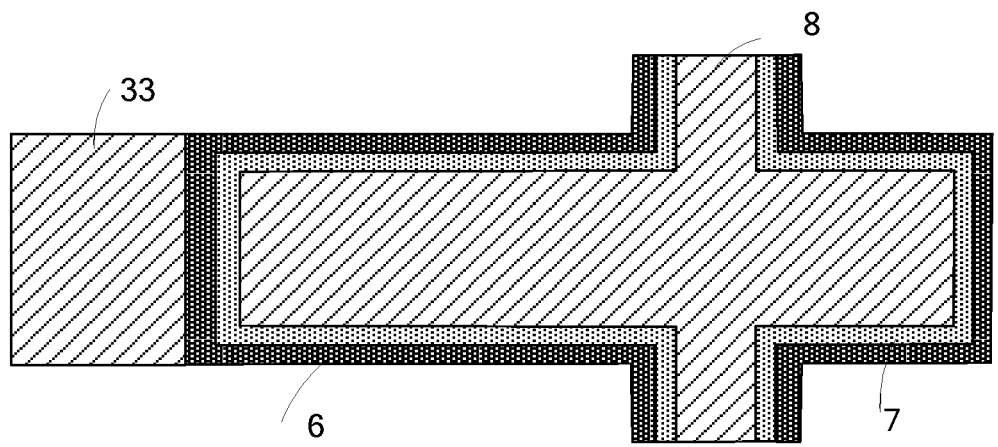
FIG. 9C is a schematic cross section diagram of FIG. 9B taken along a direction BB.

7) A second metal thin film is deposited within the channel (i.e. the through hole 41, the first channel 42 and the second channel 43) to form a second metal layer 8 which completely fills the channel, as shown in FIGS. 9A, 9B and 9C. FIG. 9C is a cross section diagram of FIG. 9B taken along a direction BB and shows only the first semiconductor layer 6, the first gate insulation layer 7 and the second metal layer 8. At this time, the first gate insulation layer 7 surrounds the second metal layer 8.

In an exemplary embodiment, the second metal thin film may include, but is not limited to, at least one of: tungsten (W), aluminum (Al), molybdenum (Mo), ruthenium (Ru), titanium nitride (TiN), and tantalum (Ta). The second metal thin film may be the same as or different from the first metal thin film.

Figure 10A:
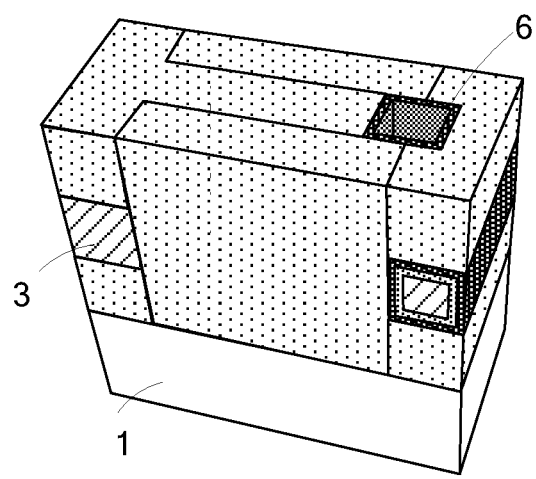
FIG. 10A is a schematic diagram after removal of a second metal layer in a through hole provided according to an exemplary embodiment
Figure 10B:
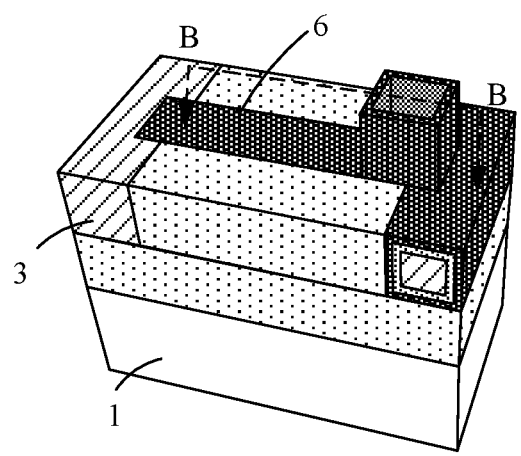
FIG. 10B is a partial schematic diagram of FIG. 10A.
Figure 10C:
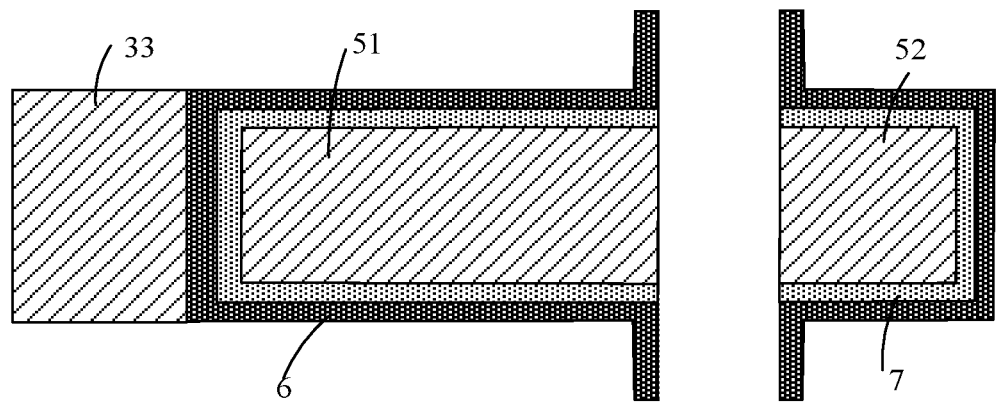
FIG. 10C is a schematic cross section diagram of FIG. 10B taken along a direction BB.

8) The second metal layer 8 and the first gate insulation layer 7 in the through hole 41 are selectively photoetched and etched to retain the second metal layer 8 (the second metal layer 8 in the first channel 42 and the second channel 43 parallel to the substrate 1) and the first gate insulation layer 7 at other positions in the channel, as shown in FIGS. 10A, 10B and 10C, wherein FIG. 10C is a cross section diagram of FIG. 10B taken along a direction BB and shows only the first semiconductor layer 6, the first gate insulation layer 7 and the second metal layer 8. The second metal layer 8 located in the first channel 42 acts as the third electrode 51 of the second transistor, and the second metal layer 8 located in the second channel 43 acts as the fourth electrode 52 of the second transistor, and the third electrode 51 and the fourth electrode 52 are disconnected from each other.

Figure 11A:
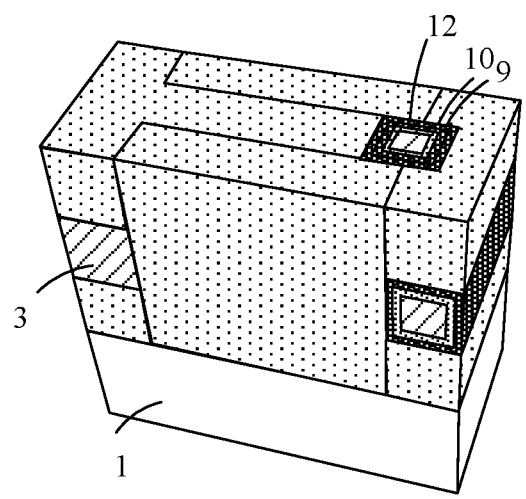
FIG. 11A is a schematic diagram after formation of a gate provided according to an exemplary embodiment.
Figure 11B:
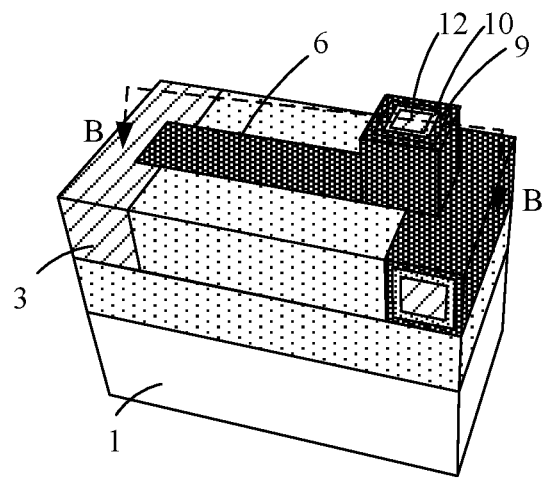
FIG. 11B is a partial schematic diagram of FIG. 11A.
Figure 11C:
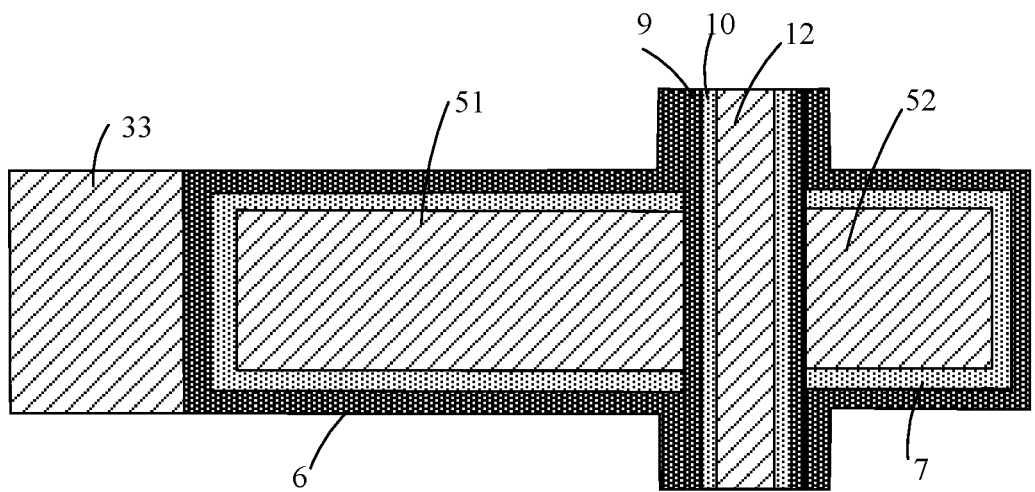
FIG. 11C is a schematic cross section diagram of FIG. 11B taken along a direction BB.

9) A second semiconductor thin film, a second gate oxide thin film and a third metal thin film are sequentially deposited on the sidewall of the etched through hole 41 to form a second semiconductor layer 9, a second gate insulation layer 10 and a second gate 12 respectively, and the second gate insulation layer 10 surrounds the second gate 12, the second semiconductor layer 9 surrounds the second gate insulation layer 10, and the second gate 12 completely fills a region surrounded by the second gate insulation layer 10. As shown in FIGS. 11A, 11B, and 11C, FIG. 11C is a cross section diagram of FIG. 11B taken along a direction BB and shows only the first semiconductor layer 6, the first gate insulation layer 7, the second semiconductor layer 9, the second gate insulation layer 10, the second metal layer 8 (the third electrode 51, the fourth electrode 52), and the second gate 12.

In an exemplary embodiment, the second gate oxide thin film may be a High-K dielectric material. The High-K dielectric material may include, but is not limited to, at least one of the following: silicon oxide, aluminum oxide, hafnium oxide. The materials of the second gate oxide thin film and the first gate oxide thin film may be the same or different.

In an exemplary embodiment, the second semiconductor thin film may use the same material as the first semiconductor thin film.

In an exemplary embodiment, the third metal thin film may include, but is not limited to, at least one of: tungsten (W), aluminum (Al), molybdenum (Mo), ruthenium (Ru), titanium nitride (TiN), and tantalum (Ta). The third metal thin film may be the same as or different from the first metal thin film and the second metal thin film. The subsequent fourth metal thin film is similar and will not be repeated here.

Figure 12:
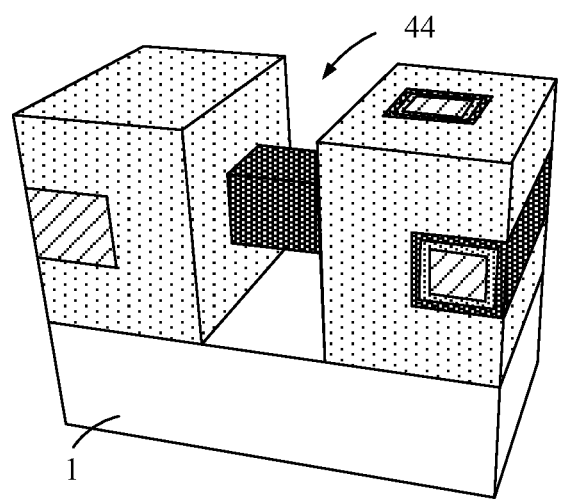
FIG. 12 is a schematic diagram after formation of an insertion slot 44 provided according to an exemplary embodiment.

10) On the substrate 1 on which aforementioned patterns are formed, an insertion slot structure 44 shown in FIG. 12 is obtained by etching without etching the first semiconductor layer 6 and portions included in the first semiconductor layer 6. The insertion slot structure 44 penetrates through each film layer on the substrate 1, and on a plane perpendicular to the substrate 1, an orthographic projection of the insertion slot structure 44 is located outside an orthographic projection of the first electrode 33, and outside an orthographic projection of the through hole 41, and outside an orthographic projection of the fourth electrode 52.

Figure 13A:
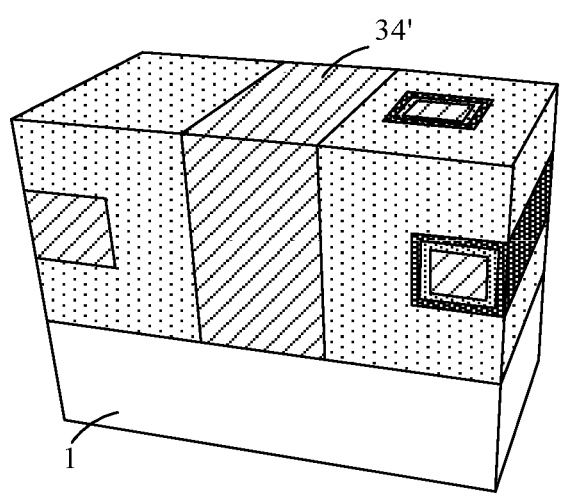
FIG. 13A is a schematic diagram after formation of a fourth metal layer 34' provided according to an exemplary embodiment.
Figure 13B:
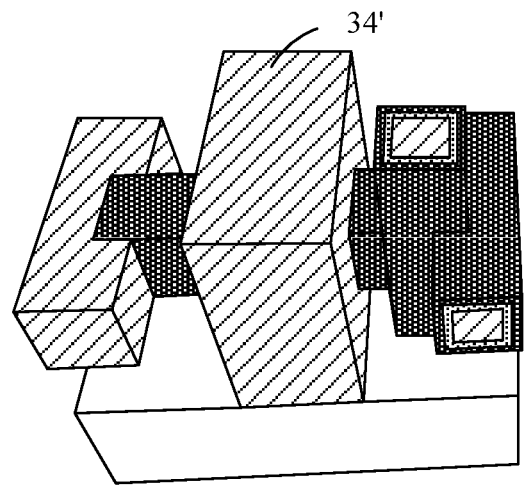
FIG. 13B is a partial schematic diagram of FIG. 13A.

11) A fourth metal thin film is deposited within the insertion slot structure 44 to form a fourth metal layer 34' filling the insertion slot structure 44, as shown in FIGS. 13A and 13B.

Figure 14A:
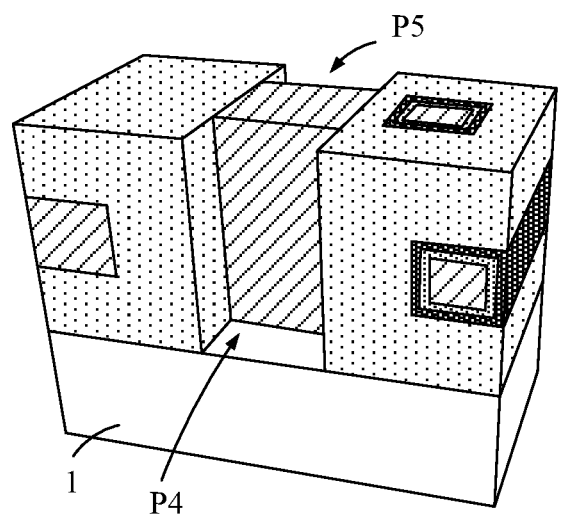
FIG. 14A is a schematic diagram after formation of an insertion slot provided according to an exemplary embodiment.
Figure 14B:
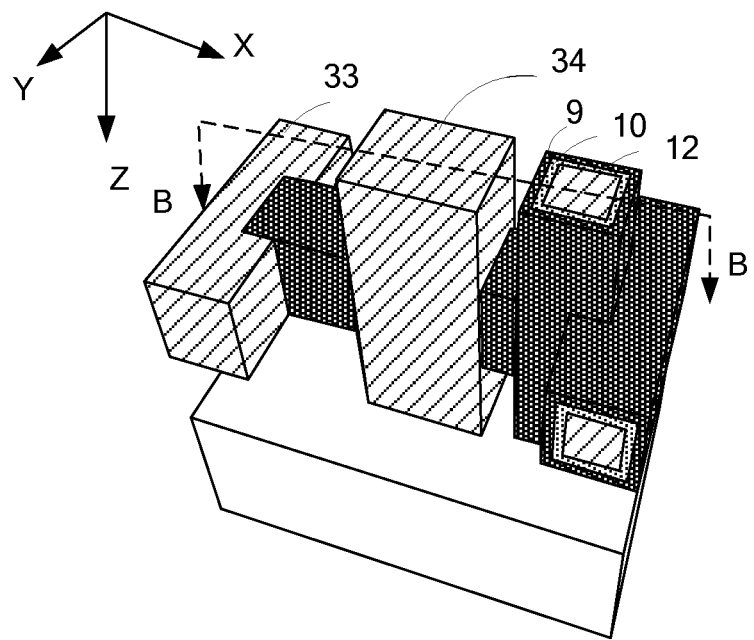
FIG. 14B is a partial schematic diagram of FIG. 14A.
Figure 14C:
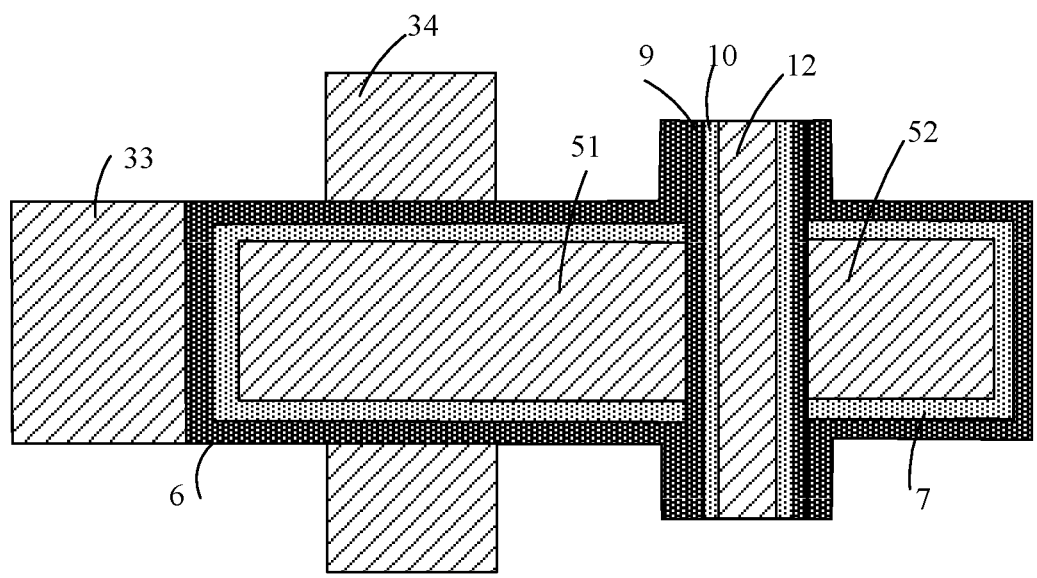
FIG. 14C is a schematic cross section diagram of FIG. 14B taken along a direction BB.

12) On the substrate 1 on which aforementioned patterns are formed, a fourth opening slot P4 and a fifth opening slot P5 penetrating through the fourth metal layer 34' and a second electrode 34 are formed, as shown in FIG. 14A, similar to the first opening slot P1 and the second opening slot P2, the fourth opening slot P4 and the fifth opening slot P5 are located at two sides of the fourth metal layer 34'respectively, the length of the second electrode 34 in the third direction Y is less than the length of the first electrode 33 in the third direction Y, and the second electrode 34 surrounds the first semiconductor layer 6, as shown in FIG. 14B. FIG. 14C is a cross section diagram of FIG. 14B taken along a direction BB, and it can be seen that the main structures of the first transistor and the second transistor are substantially fabricated.

Figure 15:
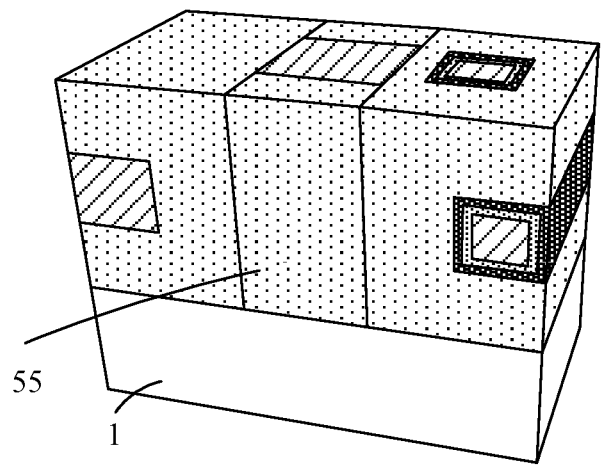
FIG. 15 is a schematic diagram after formation of a fifth insulation layer provided according to an exemplary embodiment.

13) On the substrate 1 on which aforementioned patterns are formed, a fourth insulation thin film is deposited to form a fourth insulation layer 55, which fills the fourth opening slot P4 and the fifth opening slot P5, as shown in FIG. 15.

In the memory cell prepared by the preparation process described above, a first gate insulation layer 7 surrounding the fourth electrode 52 and a first semiconductor layer 6 surrounding the first gate insulation layer 7 may exist in the second channel 43. However, an embodiment of the present disclosure is not limited thereto. In the second channel 43, the first gate insulation layer 7 surrounding the fourth electrode 52 and the first semiconductor layer 6 surrounding the first gate insulation layer 7 may not exist (except the region intersecting with the through hole 41), that is, the first gate insulation layer 7 and the first semiconductor layer 6 in the second channel 43 may be removed. The first gate insulation layer 7 and the first semiconductor layer 6 in the second channel 43 may be retained for process convenience.

In an exemplary embodiment, acts 11) and 12) described above may be omitted when only one memory cell is prepared.

The above preparation process is only an example, and the embodiments of the present disclosure are not limited thereto and preparation may be performed by other means. For example, after the first metal thin film is deposited, the H-shaped first metal layer 3 may be formed by patterning through a patterning process. Subsequently, a second insulation thin film is deposited to form a second insulation layer 4, it is not needed to slot to form a first opening slot P1 and a second opening slot P2, and it is not needed to deposit a third insulation thin film.

Figure 16:
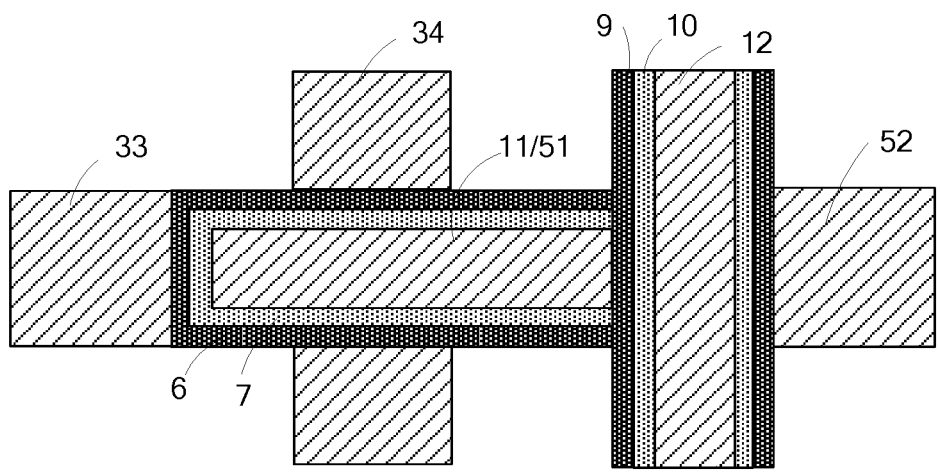
FIG. 16 is a schematic cross section diagram of a memory cell provided according to an exemplary embodiment.

FIG. 16 is a schematic cross section diagram of a memory cell provided according to an exemplary embodiment. As shown in FIG. 16, in this embodiment, the memory cell includes a first transistor and a second transistor. The first transistor may include a first electrode 33, a second electrode 34 and a first gate 11, and a first gate insulation layer 7 surrounding the first gate 11, a first semiconductor layer 6 surrounding the first gate insulation layer 7; the second transistor may include a third electrode 51, a fourth electrode 54, and a second gate 12, and a second semiconductor layer 9 extending in the first direction Z, and a second gate insulation layer 10 isolating the second semiconductor layer 9 from the second gate 12, the thickness of the fourth electrode 52 may be greater than the thickness of the third electrode 51 in a direction perpendicular to the substrate 1.

An embodiment of the disclosure also provides an electronic device, which includes the memory cell described in any one of the foregoing embodiments. The electronic device can be a storage device, a smart phone, a computer, a tablet computer, an artificial intelligence device, a wearable device or a mobile power supply, etc. The storage device may include a memory in a computer or the like, and this is not restricted here.

Figure 17A:
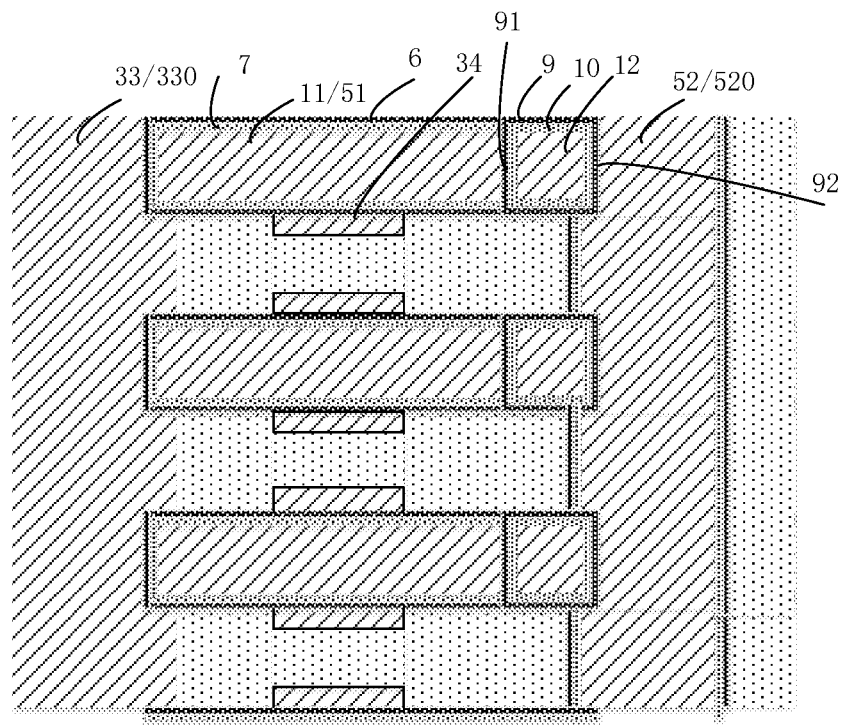
FIG. 17A is a schematic cross section diagram of a 3D memory taken along a direction parallel to a substrate provided according to an exemplary embodiment.
Figure 17B:
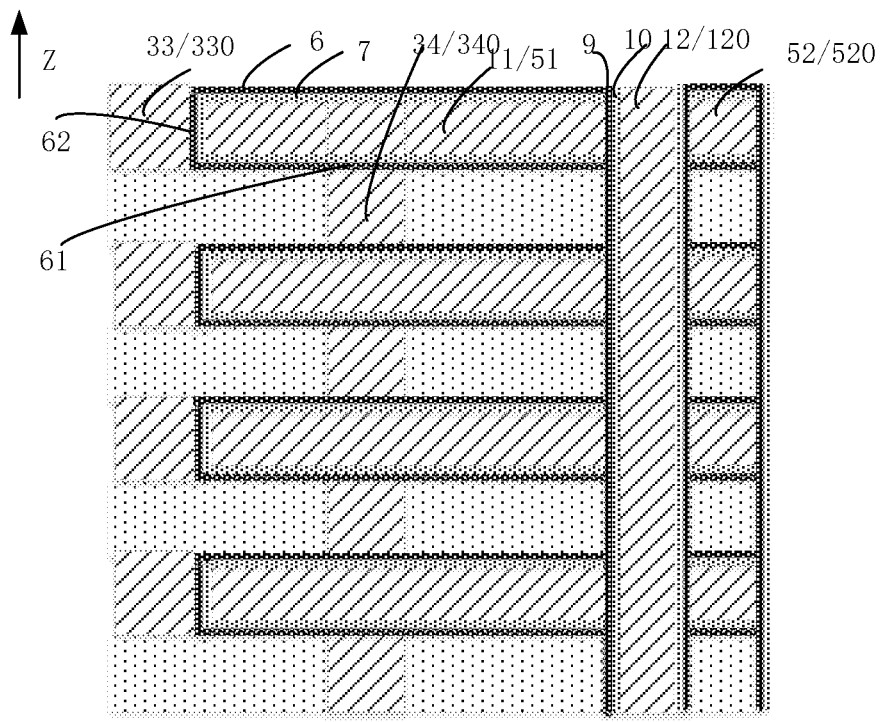
FIG. 17B is a schematic cross section diagram of a 3D memory taken along a direction perpendicular to a substrate provided according to an exemplary embodiment.

FIG. 17A is a schematic planar diagram of a 3D memory provided according to an embodiment of the present disclosure, and FIG. 17B is a schematic cross section diagram of a 3D memory provided according to an embodiment of the present disclosure. As shown in FIGS. 17A and 17B, the embodiment provides a 3D memory that may include a plurality of layers of memory cells stacked in a direction perpendicular to the substrate 1.

Each layer of the memory cell may include: a read transistor and a write transistor; the read transistor may be a first transistor and the write transistor may be a second transistor.

The read transistor includes a first gate 11, a first semiconductor layer 6, a first source (which may be a second electrode 34), and a first drain (which may be a first electrode 33), the first gate 11 may extend in a direction parallel to the substrate 1; the write transistor includes a second gate 12, a second semiconductor layer 9, a second source (which may be a third electrode 51), and a second drain (which may be a fourth electrode 52), the second gate 12 may extend in a direction perpendicular to the substrate 1.

The second source of the write transistor is connected with the first gate 11 of the read transistor; the first semiconductor layer 6 surrounds the first gate 11 and the second semiconductor layer 9 surrounds the second gate 12; a channel of the second semiconductor layer 9 of the write transistor is a horizontal channel.

In the 3D memory provided according to the embodiment, the second semiconductor layer of the write transistor surrounds the second gate, the source contact region and the drain contact region on the second semiconductor layer are arranged such that the channel direction between the source and the drain extends generally in a direction parallel to the substrate, the second transistor and the first transistor are not stacked, the structure between the first transistor and the second transistor is more compact, the size of the memory cell in a direction perpendicular to the substrate can be reduced, and the 3D stack of 2T0C memory cells with a compact structure can be conveniently manufactured, thus simplifying the process and reducing the cost.

In an exemplary embodiment, the read transistor and write transistor in the same layer are arranged at intervals on the substrate 1 along a direction parallel to the substrate 1.

In an exemplary embodiment, the first gate 11 of the read transistor and the second source of the write transistor may be of an integrated structure, and the embodiment is not limited thereto and they may be two independent electrodes.

In an exemplary embodiment, the first gate 11 may extend in a second direction parallel to the substrate 1.

The first semiconductor layer 6 may include a first source contact region 61 and a first drain contact region 62, and the second semiconductor layer 9 may include a second source contact region 91 and a second drain contact region 92.

Each layer of the memory cell may further include a first bit line 330 and a second bit line 520 extending along a third direction parallel to the substrate 1, the third direction intersects with the second direction; the first bit line 330 is connected to the first drain contact region 62 of the first semiconductor layer 6 and the second bit line 520 is connected to the second drain contact region 92 of the second semiconductor layer 9.

Each layer of the memory cell may further include a first word line 340 and a second word line 120 respectively extending in a direction perpendicular to the substrate 1.

The first word line 340 is connected to the first source contact regions 61 of the first semiconductor layers 6 of the memory cells of different layers respectively, and the second word line 120 is connected to the second gates 12 of the memory cells of different layers respectively. The second gates 12 of the memory cells of different layers may be part of the second word line 120.

With the solution provided according to the present embodiment, the second gate of each stacked write transistor can be connected as a word line, and the word line extending in the vertical direction enables the structure of 2T0C to have a simple process and save space.

In an exemplary embodiment, the first word line 340 surrounds the sidewall of each first semiconductor layer 6 of the memory cells of different layers and is connected to the first source contact region 61 of the sidewall of each first semiconductor layer 6.

In an exemplary embodiment, the first gate 11 has a sidewall, a first end connected to the second source contact region 91 of the second semiconductor layer 9, and a second end connected to the first bit line 330.

In an exemplary embodiment, the second semiconductor layers 9 of the write transistors of different layers may be of an integrated structure.

In an exemplary embodiment, the write transistors of different layers may share one annular second semiconductor layer 9 extending in a direction perpendicular to the substrate 1.

In an exemplary embodiment, the write transistor may further include a second gate insulation layer 10 surrounding the second gate 12, and the second semiconductor layer 9 surrounds the second gate insulation layer 10.

In an exemplary embodiment, the write transistors of different layers may share one annular second gate insulation layer 10 extending in a direction perpendicular to the substrate 1.

In an exemplary embodiment, the projections of the first gates 11 of different layers on the substrate 1 may be located in the same region, the projections of the first sources of different layers on the substrate 1 may be located in the same region, the projections of the first drains of different layers on the substrate 1 may be located in the same region, the projections of the second gates 12 of different layers on the substrate 1 may be located in the same region, the projections of the second sources of different layers on the substrate 1 may be located in the same region, and the projections of the second drains of different layers on the substrate 1 may be located in the same region.

The structures of the read transistor and the write transistor in the 3D memory described above may refer to the structures of the first transistor and the second transistor in the aforementioned embodiments and will not be described here.

Figure 18:
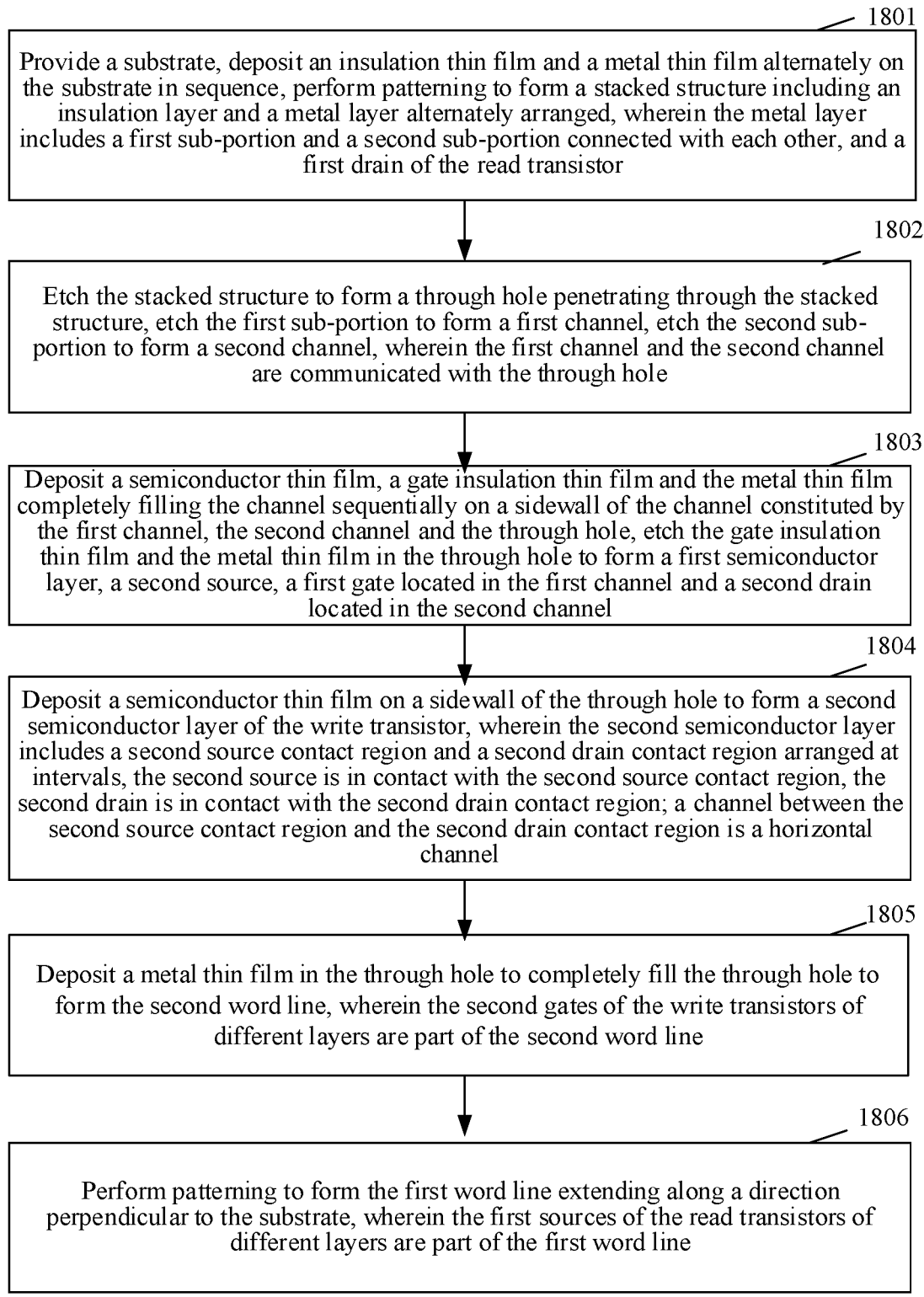
FIG. 18 is a flowchart of a preparation method for a 3D memory provided according to an exemplary embodiment.

As shown in FIG. 18, an embodiment of the present disclosure provides a preparation method for a 3D memory, wherein the 3D memory includes a plurality of layers of memory cells stacked in a direction perpendicular to a substrate, a first word line and a second word line, each layer of the memory cell includes a read transistor and a write transistor, the read transistor includes a first gate, a first semiconductor layer, a first source and a first drain, the write transistor includes a second gate, a second semiconductor layer, a second source and a second drain, the preparation method may include following acts.

In act 1801, a substrate is provided, an insulation thin film and a metal thin film are deposited alternately on the substrate in sequence, patterning is performed to form a stacked structure including an insulation layer and a metal layer alternately arranged, wherein the metal layer includes a first sub-portion and a second sub-portion connected with each other, and a first drain of the read transistor.

In act 1802, the stacked structure is etched to form a through hole penetrating through the stacked structure, the first sub-portion is etched to form a first channel, the second sub-portion is etched to form a second channel, wherein the first channel and the second channel are communicated with the through hole.

In act 1803, a semiconductor thin film, a gate insulation thin film and a metal thin film completely filling the channel are deposited sequentially on a sidewall of the channel constituted by the first channel, the second channel and the through hole, the gate insulation thin film and the metal thin film in the through hole are etched to form a first semiconductor layer, a second source, a first gate located in the first channel and a second drain located in the second channel.

In act 1804, a semiconductor thin film is deposited on a sidewall of the through hole to form a second semiconductor layer of the write transistor, wherein the second semiconductor layer includes a second source contact region and a second drain contact region arranged at intervals, the second source is in contact with the second source contact region, the second drain is in contact with the second drain contact region; a channel between the second source contact region and the second drain contact region is a horizontal channel.

In act 1805, a metal thin film is deposited in the through hole to completely fill the through hole to form the second word line, wherein the second gates of the write transistors of different layers are part of the second word line.

In act 1806, patterning is performed to form the first word line extending along a direction perpendicular to the substrate, wherein the first sources of the read transistors of different layers are part of the first word line.

In the 3D memory prepared by the preparation method for the 3D memory provided according to an embodiment of the disclosure, the gate of the second transistor is of a vertical structure and the channel is a horizontal channel and is not stacked with the first transistor, so that the size of the memory cell in the direction perpendicular to the substrate can be reduced, and the 3D stack of the 2T0C memory cell with a compact structure can be conveniently prepared, thus simplifying the process and reducing the cost. In addition, the 3D memory provided according to the embodiment can change the channel size by adjusting the thickness of the source or drain, which has the advantage of simple process and little influence on the size of the transistor. The preparation method according to an embodiment of the disclosure can be realized by utilizing the existing mature preparation equipment, has relatively small improvement on the existing process, can be well compatible with the existing preparation process, is easy to realize the process, is easy to implement, and has high production efficiency, low production cost and high yield.

Although implementations disclosed in the present disclosure are as described above, the described contents are only implementations used for facilitating understanding of the present disclosure, but are not intended to limit the present disclosure. Without departing from the spirit and scope disclosed in the present disclosure, any person skilled in the art to which the present disclosure belongs may make any modifications and changes in the form and details of implementation, but the scope of patent protection of the present disclosure shall still be defined by the appended claims.

The invention claimed is:

1. A memory cell, comprising a first transistor and a second transistor disposed on a substrate, wherein,
   the first transistor and the second transistor are arranged at intervals on the substrate along a direction approximately parallel to the substrate;
   the first transistor comprises a first gate, a first electrode, a second electrode and a first semiconductor layer disposed on the substrate, the first gate extends along the direction parallel to the substrate;
   the second transistor comprises a third electrode, a fourth electrode, a second gate extending along a direction perpendicular to the substrate, and a second semiconductor layer surrounding a sidewall of the second gate which are disposed on the substrate, the first gate is connected to the second semiconductor layer; the second semiconductor layer comprises a second source contact region and a second drain contact region arranged at intervals, the third electrode is in contact with the second source contact region of the second semiconductor layer, the fourth electrode is in contact with the second drain contact region of the second semiconductor layer, and a channel between the second source contact region and the second drain contact region is a horizontal channel.

2. The memory cell according to claim 1, wherein, on a plane perpendicular to the substrate, an orthographic projection of the first gate is overlapped with an orthographic projection of the third electrode, an orthographic projection of the third electrode is overlapped with an orthographic projection of the fourth electrode, and the first gate of the first transistor and the third electrode of the second transistor are of an integrated structure.

3. The memory cell according to claim 2, wherein the second transistor further comprises a second gate insulation layer disposed between the second gate and the second semiconductor layer and surrounding the sidewall of the second gate; along a direction perpendicular to the substrate, a length of the second semiconductor layer is less than or equal to a length of the second gate insulation layer, and is greater than or equal to a length of the third electrode, and is greater than or equal to a length of the fourth electrode.

4. The memory cell according to claim 1, wherein the first gate is connected to the second source contact region of the second semiconductor layer.

5. The memory cell according to claim 4, wherein the second drain contact region of the second semiconductor layer and the second source contact region of the second semiconductor layer are located at a sidewall of the second semiconductor layer and are arranged oppositely at intervals.

6. The memory cell according to claim 5, wherein materials of the first semiconductor layer and the second semiconductor layer comprise a metal oxide semiconductor material.

7. The memory cell according to claim 6, wherein a metal in the metal oxide semiconductor material comprises at least one of indium, tin, zinc, aluminum, and gallium.

8. The memory cell according to claim 1, wherein, on a plane perpendicular to the substrate, an orthographic projection of the first electrode is overlapped with an orthographic projection of the first gate.

9. The memory cell according to claim 5, wherein the second electrode surrounds and is connected with the first semiconductor layer, on a plane perpendicular to the substrate, a cross section of the second electrode has an annular opening, and the first semiconductor layer is located within the opening of the second electrode.

10. The memory cell according to claim 8, wherein the first electrode extends along a third direction, the first gate extends along a second direction, the third electrode extends along the second direction, and the fourth electrode extends along the third direction, the second direction and the third direction intersects with each other and are parallel to the substrate.

11. The memory cell according to claim 8, wherein a distance between a surface at side of the first electrode close to the substrate and the substrate is less than a distance between a surface at a side of the third electrode close to the substrate and the substrate, a distance between a surface at a side of the first electrode away from the substrate and the substrate is greater than a surface at a side of the third electrode away from the substrate and the substrate.

12. The memory cell according to claim 9, wherein the first electrode is disposed at a side of the second electrode away from the second gate.

13. The memory cell according to claim 9, wherein the first semiconductor layer comprises a sidewall and two ends, the first semiconductor layer comprises a first source contact region and a first drain contact region, the first source contact region is located at the sidewall of the first semiconductor layer and surrounds the first semiconductor layer, and the first drain contact region is located at the sidewall of the first semiconductor layer and surrounds the first semiconductor layer, or located at one of the two ends away from the second gate.

14. The memory cell according to claim 9, wherein, on a plane parallel to the substrate, an orthographic projection of the first electrode and an orthographic projection of the second electrode are not overlapped, an orthographic projection of the third electrode and an orthographic projection of the fourth electrode are not overlapped.

15. The memory cell according to claim 9, wherein, on a cross section perpendicular to the substrate, the first electrode, the second electrode, the third electrode are located at a first side of the second gate, and the fourth electrode is located at a second side of the second gate, and the first side and the second side are two opposite sides.

16. An electronic device, comprising the memory cell according to claim 1.

17. A memory cell, comprising a read transistor and a write transistor disposed on a substrate, wherein
the read transistor and the write transistor are arranged at intervals on the substrate along a direction approximately parallel to the substrate;
the read transistor comprises a first gate, a first semiconductor layer, a first source and a first drain; the first semiconductor layer surrounds the first gate; the first gate extends along the direction parallel to the substrate;
the write transistor comprises a second gate, a second semiconductor layer, a second source and a second drain; the second semiconductor layer surrounds the second gate; the second gate extends along a direction perpendicular to the substrate, and the second source of the write transistor is connected to the first gate of the read transistor;
a channel of the second semiconductor layer of the write transistor is a horizontal channel.

18. The memory cell according to claim 17, wherein,
the second gate extends along a direction perpendicular to the substrate and has a sidewall, the second semiconductor layer surrounds the sidewall, the second semiconductor layer comprises a second source contact region;
the first gate extends along a direction parallel to the substrate and has a sidewall and two ends, the first semiconductor layer at least surrounds the sidewall, one of the two ends extends to the second source contact region of the second semiconductor layer to be in contact with the second semiconductor layer.

19. The memory cell according to claim 18, wherein the sidewall of the second semiconductor layer further comprises a second drain contact region; the second source contact region and the second drain contact region are located at different regions of the sidewall of the second semiconductor layer, and orthographic projections of the second source contact region and the second drain contact region in a plane perpendicular to the substrate have an overlapped region, to enable that a channel between the second source contact region and the second drain contact region is parallel to the substrate;
the sidewall of the first semiconductor layer has a first source contact region and a first drain contact region, and a channel between the first source contact region and the first drain contact region is parallel to the substrate.

20. A 3D memory, comprising a plurality of layers of memory cells stacked in a direction perpendicular to a substrate, wherein,
each layer of a memory cell comprises a read transistor and a write transistor; the read transistor and the write transistor of a same layer are arranged at intervals on the substrate along a direction approximately parallel to the substrate;
the read transistor comprises a first gate, a first semiconductor layer, a first source, and a first drain, the first gate extends along the direction parallel to the substrate; the write transistor comprises a second gate, a second semiconductor layer, a second source, and a second drain, the second gate extends along a direction perpendicular to the substrate;
the second source of the write transistor is connected with the first gate of the read transistor; the first semiconductor layer surrounds the first gate and the second semiconductor layer surrounds the second gate; a channel of the second semiconductor layer of the write transistor is a horizontal channel.

21. The 3D memory according to claim 20, wherein the first gate of the read transistor and the second source of the write transistor are of an integrated structure.

22. The 3D memory according to claim 20, wherein the first gate extends along a second direction parallel to the substrate;
the first semiconductor layer comprises a first source contact region and a first drain contact region, and the second semiconductor layer comprises a second source contact region and a second drain contact region;
each layer of the memory cell further comprises a first bit line and a second bit line extending along a third direction parallel to the substrate, the third direction intersects with the second direction; the first bit line is connected to the first drain contact region of the first semiconductor layer, and the second bit line is connected to the second drain contact region of the second semiconductor layer;
each layer of the memory cell further comprises a first word line and a second word line respectively extending along a direction perpendicular to the substrate;
the first word line is respectively connected to first source contact regions of first semiconductor layers of the memory cells of different layers, and the second word line is respectively connected to second gates of the memory cells of different layers.

23. The 3D memory according to claim 22, wherein the first word line surrounds a sidewall of each first semiconductor layer of the memory cells of different layers and is connected to the first source contact region of the sidewall of each first semiconductor layer.

24. The 3D memory according to claim 22, wherein the first gate has a sidewall, a first end, and a second end, the first end is connected to the second source contact region of the second semiconductor layer, and the first bit line is connected to the second end.

25. A preparation method for a 3D memory, wherein, the 3D memory comprises a plurality of layers of memory cells stacked in a direction perpendicular to a substrate, a first word line and a second word line, each layer of a memory cell comprises a read transistor and a write transistor, the read transistor comprises a first gate, a first semiconductor layer, a first source and a first drain, the write transistor comprises a second gate, a second semiconductor layer, a second source and a second drain, the preparation method comprises:
providing a substrate;
depositing an insulation thin film and a metal thin film alternately on the substrate in sequence, patterning to form a stacked structure comprising an insulation layer and a metal layer arranged alternately, wherein the metal layer comprises a first sub-portion and a second sub-portion connected with each other and a first drain of the read transistor;
etching the stacked structure to form a through hole penetrating through the stacked structure, etching the first sub-portion to form a first channel, etching the second sub-portion to form a second channel, wherein the first channel and the second channel are communicated with the through hole;
depositing a semiconductor thin film, a gate insulation thin film and a metal thin film completely filling the channel sequentially on a sidewall of a channel constituted by the first channel, the second channel and the through hole, etching the gate insulation thin film and the metal thin film in the through hole to form a first semiconductor layer, a second source, a first gate located in the first channel and a second drain located in the second channel;

depositing a semiconductor thin film on a sidewall of the through hole to form a second semiconductor layer of the write transistor, wherein the second semiconductor layer comprises a second source contact region and a second drain contact region arranged at intervals, the second source is in contact with the second source contact region, the second drain is in contact with the second drain contact region; a channel between the second source contact region and the second drain contact region is a horizontal channel;

depositing a metal thin film in the through hole to completely fill the through hole to form the second word line, wherein second gates of write transistors of different layers are part of the second word line;

patterning to form the first word line extending along a direction perpendicular to the substrate, wherein first sources of read transistors of different layers are part of the first word line.

\* \* \* \* \*